(12) United States Patent
Strano et al.

(10) Patent No.: US 11,616,184 B2
(45) Date of Patent: Mar. 28, 2023

(54) MATERIALS, DEVICES, AND METHODS FOR RESONANT AMBIENT THERMAL ENERGY HARVESTING USING THERMAL DIODES

(71) Applicant: Massachusetts Institute of Technology, Cambridge, MA (US)

(72) Inventors: Michael S. Strano, Lexington, MA (US); Anton Lee Cottrill, Cambridge, MA (US); Sayalee Girish Mahajan, Cambridge, MA (US); Tianxiang Liu, Cambridge, MA (US); Volodymyr B. Koman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 363 days.

(21) Appl. No.: 16/120,125

(22) Filed: Aug. 31, 2018

(65) Prior Publication Data

US 2020/0028053 A1    Jan. 23, 2020

Related U.S. Application Data

(60) Provisional application No. 62/552,497, filed on Aug. 31, 2017.

(51) Int. Cl.
  *H01L 35/30* (2006.01)
  *H01L 35/02* (2006.01)
  (Continued)

(52) U.S. Cl.
  CPC ............. *H01L 35/30* (2013.01); *H01L 35/02* (2013.01); *H01L 35/32* (2013.01); *F03G 7/04* (2013.01);
  (Continued)

(58) Field of Classification Search
  CPC ......... H01L 35/00; H01L 35/02; H01L 35/28; H01L 35/30; H01L 35/32; H01L 35/34; H02S 40/44; H02S 10/30; H02N 11/002
  (Continued)

(56) References Cited

U.S. PATENT DOCUMENTS

| 4,086,769 A | 5/1978 | Smith |
| 2005/0172993 A1 | 8/2005 | Shimoji et al. |

(Continued)

FOREIGN PATENT DOCUMENTS

| EP | 1840980 A1 | 10/2007 |
| WO | 2009/111008 A1 | 9/2009 |
| WO | 2014/110226 A1 | 7/2014 |

OTHER PUBLICATIONS

Wang et al., Microscale solid-state thermal diodes enabling ambient temperature thermal circuits for energy applications, 2017, Phys. Chem. Chem.Phys., 19, 13172-13181. (Year: 2017).*

(Continued)

*Primary Examiner* — Andrew J Golden
(74) *Attorney, Agent, or Firm* — Barnes & Thornburg LLP

(57) ABSTRACT

The present disclosure is directed to materials, devices, and methods for resonant ambient thermal energy harvesting. Thermal energy can be harvested using thermoelectric resonators that capture and store ambient thermal fluctuations and convert the fluctuations to energy. The resonators can include non-linear heat transfer elements, such as thermal diodes, to enhance their performance. Incorporation of thermal diodes can allow for a dynamic rectification of temperature fluctuations into a single polarity temperature difference across a heat engine for power extraction, as compared to the dual polarity nature of the output voltage of linear thermal resonators, which typically necessitates electrical rectification to be routed to an entity for energy (Continued)

storage. In some embodiments, the thermal diode can be applied to transient energy harvesting to construct thermal diode bridges. Methods for constructing such devices, and using such devices, are also provided.

23 Claims, 6 Drawing Sheets

(51) Int. Cl.
    *H01L 35/32*     (2006.01)
    *H02N 11/00*     (2006.01)
    *H02S 40/44*     (2014.01)
    *F03G 7/06*     (2006.01)
    *F03G 7/04*     (2006.01)

(52) U.S. Cl.
    CPC .............. *F03G 7/06* (2013.01); *H02N 11/002* (2013.01); *H02S 40/44* (2014.12)

(58) Field of Classification Search
    USPC .................................................. 136/200–242
    See application file for complete search history.

(56) References Cited

U.S. PATENT DOCUMENTS

| | | | | |
|---|---|---|---|---|
| 2008/0128012 | A1* | 6/2008 | Schick | H01L 35/30 136/200 |
| 2008/0149159 | A1* | 6/2008 | Logan | H01L 35/30 136/205 |
| 2010/0078054 | A1* | 4/2010 | Chatterjee | H01L 35/30 136/224 |
| 2011/0120116 | A1 | 5/2011 | Alexander et al. | |
| 2012/0152297 | A1* | 6/2012 | Mitchell | H01L 35/30 136/205 |
| 2012/0181859 | A1* | 7/2012 | Nagy | H01L 35/30 307/9.1 |
| 2019/0063412 | A1 | 2/2019 | Strano et al. | |

OTHER PUBLICATIONS

Zhao, Master's Thesis, Thermal Diode Bridge Applied to Solar Energy Harvesting, 2015 (Year: 2015).*
Gustafsson et al., "Thermal conductivity, thermal diffusivity, and specific heat of thin samples from transient measurements with hot disk sensors," Review of Scientific Instruments, vol. 65, pp. 3856-3859, 1994 (5 pages).
Gustafsson, S. E., "Transient plane source techniques conductivity and thermal diffusivity measurements of solid materials," Review of Scientific Instruments, vol. 62, No. 3, pp. 797-804, Mar. 1991 (9 pages).
Guyomar et al., "Energy Harvesting from Ambient Vibrations and Heat," Journal of Intelligent Material Systems and Structures, vol. 20, Issue 5, pp. 609-624, Mar. 2009 (16 pages).
Guyomar et al., "Toward Heat Energy Harvesting using Pyroelectric Material," Journal of Intelligent Material Systems and Structures, vol. 20, Issue 3, pp. 265-271, Feb. 2009 (7 pages).
Hamilton et al., "Observations and preliminary science results from the first 100 sols of MSL Rover Environmental Monitoring Station ground temperature sensor measurements at Gale Crater," Journal of Geophysical Research: Planets, vol. 119, Issue 4, pp. 745-770, Apr. 2014 (26 pages).
Harish et al., "Anomalous thermal conduction characteristics of phase change composites with single-walled carbon nanotube inclusions," The Journal of Physical Chemistry, vol. 117, Issue 29, pp. 15409-15413, Jun. 2013 (5 pages).
Hashin et al., "A Variational Approach to the Theory of the Effective Magnetic Permeability of Multiphase Materials," Journal of Applied Physics, vol. 33, Article No. 3125, 1962 (8 pages).
Herbert et al., "A review of wind energy technologies," Renewable and Sustainable Energy Reviews, vol. 11, Issue 6, pp. 1117-1145, Aug. 2007 (29 pages).
Howells, C. A., "Piezoelectric energy harvesting," Energy Conversion and Management, vol. 50, Issue 7, pp. 1847-1850, Jul. 2009 (4 pages).
Hu et al., "Thermal Conductivity and Thermal Rectification in Graphene Nanoribbons: A Molecular Dynamics Study," Nano Letters, vol. 9, No. 7, pp. 2730-2735, Jun. 2009 (6 pages).
Huang et al., "Improved wetting behavior and thermal conductivity of the three-dimensional nickel foam/epoxy composites with graphene oxide as interfacial modifier," Applied Physics A, vol. 112, p. 515, 2016 (7 pages).
International Search Report and Written Opinion for Application No. PCT/US18/49261 dated Oct. 11, 2019 (11 pages).
International Search Report and Written Opinion for Application No. PCT/US18/49265 dated Dec. 13, 2019 (15 pages).
Invitation to Pay Additional Fees for Application No. PCT/US18/49265 dated Oct. 21, 2019 (11 pages).
Ismail et al., "Genetic algorithm based optimization on modeling and design of hybrid renewable energy systems," Energy Conversion and Management, vol. 85, pp. 120-130, Sep. 2014 (11 pages).
Ito et al., "Experimental investigation of radiative thermal rectifier using vanadium dioxide," Applied Physics Letters, vol. 105, Article No. 253503, 2014 (6 pages).
Ito et al., "Multilevel radiative thermal memory realized by the hysteretic metal-insulator transition of vanadium dioxide," Applied Physics Letters, vol. 108, Article No. 053507, 2016 (6 pages).
Jezowski et al., "Heat-Flow Asymmetry on a Junction of Quartz with Graphite," Physica Status Solidi (a), vol. 47, Issue 1, pp. 229-232, May 1978 (4 pages).
Kandilian et al., "The pyroelectric energy harvesting capabilities of PMN-PT near the morphotropic phase boundary," Smart Materials and Structures, vol. 20, Article No. 055020, 2011 (11 pages).
Khamooshi et al., "A Review of Solar Photovoltaic Concentrators," International Journal of Photoenergy, 2014 (18 pages).
Khodayar et al., "Nonlinear pyroelectric energy harvesting from relaxor single crystals," IEEE Transactions on Ultrasonics, Ferroelectrics, and Frequency Control, vol. 56, No. 4, pp. 693-699, 2009 (7 pages).
Kim et al., "Macroscopic Thermal Rectification Device Using Vanadium Dioxide Thin Film," International Journal of Thermophysics, vol. 38, p. 172, 2017 (8 pages).
Kislitsyn et al., "Thermal Rectifier Based on pn Junction," IEEE Transactions on Electron Devices, vol. 61, No. 2, pp. 548-551, Feb. 2014 (4 pages).
Kobayashi et al., "An oxide thermal rectifier," Applied Physics Letters, vol. 95, Article No. 171905, 2009 (4 pages).
Kobayashi et al., "Thermal Rectification in the Vicinity of a Structural Phase Transition," Applied Physics Express, vol. 5, Article No. 027302, Jan. 2012 (4 pages).
Kreith et al., "Principles of Heat Transfer," Cengage Learning, Inc., 2011 (784 pages).
Krishnan et al., "Pyroelectric-based solar and wind energy harvesting system," IEEE Transactions on Sustainable Energy, vol. 5, No. 1, pp. 73-81, Jan. 2014 (9 pages).
Kumar, P et al., "Thermal conductivity correlations of open-cell foams: Extension of Hashin-Shtrikman model and introduction of effective solid phase tortuosity," International Journal of Heat and Mass Transfer, vol. 92, pp. 539-549, Jan. 2016 (11 pages).
Kuznik et al., "Optimization of a phase change material wallboard for building use," Applied Thermal Engineering, vol. 28, Issues 11-12, pp. 1291-1298, Aug. 2008 (8 pages).
Lee et al., "Pyroelectric waste heat energy harvesting using heat condition," Applied Thermal Engineering, vol. 37, pp. 30-37, May 2012 (8 pages).
Lertsatitthanakom et al., "Electricity Generation from a Solar Parabolic Concentrator Coupled to a Thermoelectric Module," Energy Procedia, vol. 52, pp. 150-158, 2014 (9 pages).
Li et al., "Thermal Diode: Rectification of Heat Flux," Physical Review Letters, vol. 93, No. 18, Oct. 2004 (4 pages).

(56) References Cited

OTHER PUBLICATIONS

Li et al., "Interface thermal resistance between dissimilar anharmonic lattices," Physical Review Letters, vol. 95, Article No. 104302, Sep. 2005 (4 pages).
Li et al., "Experimental and numerical studies on melting phase change heat transfer in open-cell metallic foams filled with paraffin," Applied Thermal Engineering, vol. 37, pp. 1-9, May 2012 (9 pages).
Li et al., "Phase change behavior of latent heat storage media based on calcium chloride hexahydrate composites containing strontium chloride hexahydrate and oxidation expandable graphite," Applied Thermal Engineering, vol. 102, pp. 38-44, Jun. 2016 (7 pages).
Lissant "The geometry of high-internal-phase-ratio emulsions," Journal of Colloid and Interface Science, vol. 22, Issue 6, pp. 462-468, Nov. 1966 (7 pages).
Lissant et al., "A study of medium and high internal phase ratio water/polymer emulsions," Journal of Colloid and Interface Science, vol. 42, No. 1, pp. 201-208, Jan. 1973 (8 pages).
Liu et al., "A novel PCM of lauric-myristic-stearic acid/expanded graphite composite for thermal energy storage," Materials Letters, vol. 102, pp. 43-46, Apr. 2014 (4 pages).
Lu et al., "Wireless Networks with RF Energy Harvesting: A Contemporary Survey," IEEE Communications Surveys & Tutorials, vol. 17, No. 2, pp. 757-789, Nov. 2014 (33 pages).
Maixner et al., "Assessment of near-surface ground temperature profiles for optimal placement of a thermoelectric device," Energy Conversion and Management, vol. 50, Issue 9, pp. 2361-2365, Sep. 2009 (5 pages).
Maldovan, M, "Sound and heat revolutions in phononics.", Nature, vol. 503, pp. 209-217, Nov. 14, 2013 (9 pages.
Manolakos et al., "On site experimental evaluation of a low-temperature solar organic Rankine cycle system for RO desalination," Solar Energy, vol. 83, Issue 5, pp. 646-656, May 2009 (11 pages).
Martinelli et al., "Experimental study of a phase change thermal energy storage with copper foam," Applied Thermal Engineering, vol. 101, pp. 247-261, May 2016 (15 pages).
Martinez-Flores et al., "Magnon-mediated thermal rectification with forward-bias and breakdown temperatures," Journal of Applied Physics, vol. 114, Article No. 104904, 2013 (9 pages).
Martinez-Perez et al., "Rectification of electronic heat current by a hybrid thermal diode," Nature Nanotechnology, vol. 10, pp. 303-307, 2015 (7 pages).
Marucha et al., "Heat-Flow Rectification in Inhomogeneous GaAs," Physica Status Solidi (a), vol. 31, Issue 1, pp. 269-273, Sep. 1975 (5 pages).
Mbewe et al., "A model of silicon solar cells for concentrator photovoltaic and photovoltaic/thermal system design," Solar Energy, vol. 35, No. 3, pp. 247-258, 1985 (12 pages).
McKenzie et al., "Groundwater flow with energy transport and water-ice phase change: Numerical simulations, benchmarks, and application to freezing in peat bogs," Advances in Water Resources, vol. 30, Issue 4, pp. 966-983, Apr. 2007 (18 pages).
Meysenc et al., "Power electronics cooling effectiveness versus thermal inertia," IEEE Transactions on Power Electronics, vol. 20, No. 3, pp. 687-693, May 2005 (7 pages).
Moser et al., "Thermoelectric energy harvesting from transient ambient temperature gradients," Journal of Electronic Materials, vol. 41, Issue 6, pp. 1653-1661, Jun. 2012 (9 pages).
Agbossou et al., "Solar micro-energy harvesting based on thermoelectric and latent heat effects. Part I: theoretical analysis," Sensors and Actuators A: Physical, vol. 163, Issue 1, pp. 277-283, Sep. 2010 (7 pages).
Agyenim et al., "A review of materials, heat transfer and phase change problem formulation for latent heat thermal energy storage systems (LHTESS)," Renewable and Sustainable Energy Reviews, vol. 14, Issue 2, pp. 615-628, Feb. 2010 (14 pages).

Akhtar et al., "Energy replenishment using renewable and traditional energy resources for sustainable wireless sensor networks: A review," Renewable and Sustainable Energy Reviews, vol. 45, pp. 769-784, May 2015 (16 pages).
Akyildiz et al., "Underwater acoustic sensor networks: research challenges," Ad Hoc Networks, vol. 3, Issue 3, pp. 257-279, May 2005 (23 pages).
Alaghemandi et al., "The thermal conductivity and thermal rectification of carbon nanotubes studied using reverse non-equilibrium molecular dynamics simulations," Nanotechnology, vol. 20, Article No. 115704, 2009 (9 pages).
Alaghemandi et al., "Thermal rectification in mass-graded nanotubes: a model approach in the framework of reverse ion-equilibrium molecular dynamics simulations," Nanotechnology, vol. 21, Article No. 075704, Jan. 18, 2010 (7 pages).
Alaghemandi et al., "Thermal rectification in nanosized model systems: A molecular dynamics approach," Physical Review B, vol. 81, Article No. 125410, Mar. 5, 2010 (12 pages).
Attia et al., "Experimental studies of thermoelectric power generation in dynamic temperature environments," Energy, vol. 60, pp. 453-456, Oct. 1, 2013 (4 pages).
Baetens et al., "Phase change materials for building applications: a state-of-the-art review," Energy and Buildings, vol. 12, Issue 9, pp. 1361-1368, Sep. 2010 (8 pages).
Bajpai et al., "Hybrid renewable energy systems for power generation in stand-alone applications: a review," Renewable and Sustainable Energy Reviews, vol. 16, Issue 5, pp. 2926-2939, Jun. 2012 (14 pages).
Balcerek et al., "Heat-Flux Rectification in Tin-?-Brass System," Physica Status Solidi (a), vol. 47, Issue 2, pp. K125-K128, Jun. 16, 1978 (4 pages).
Balderas-Lopez et al., "Photoacoustic measurements of transparent liquid samples: thermal effusivity," Measurement Science and Technology, vol. 6, No. 8, pp. 1163-1168, 1995 (7 pages).
Barbier, E, "Geothermal energy technolgoy and current status: an overview," Renewable and Sustainable Energy Reviews, vol. 6, Issue 1-2, pp. 3-65, 2002 (63 pages).
Bayramoglu, E. C., "Thermal properties and stability of n-octadecane based composites containing multiwalled carbon nanotubes.", Polymer Composites, vol. 32, Issue 6, pp. 904-909, 2011 (6 pages).
Ben-Abdallah et al., "Phase-change radiative thermal diode," Applied Physics Letters, vol. 103, Article No. 191907, 2013 (4 pages).
Bierman et al., "Enhanced photovoltaic energy conversion using thermally based spectral shaping," Nature Energy, vol. 1, Article No. 16068, May 23, 2016 (7 pages).
Bomberger et al., "Modeling passive power generation in a temporally-varying temperature environment via thermoelectrics," Applied Thermal Engineering, vol. 56, Issues 1-2, pp. 152-158, Jul. 2013 (7 pages).
Boreyko et al., "Planar jumping-drop thermal diodes," Applied Physics Letters, vol. 99, Article No. 234105, 2011 (4 pages).
Boreyko et al., "Vapor chambers with jumping-drop liquid return from superhydrophobic condensers," International Journal of Heat and Mass Transfer, vol. 61, pp. 409-418, Jun. 2013 (10 pages).
Bowen et al., "Pyroelectric materials and devices for energy harvesting applications," Energy and Environmental Science, vol. 7, Issue 12, pp. 3836-3856, 2014 (22 pages).
Buckle et al., "Autonomous Underwater Vehicle Thermoelectric Power Generation," Journal of Electronic Materials, vol. 42, Issue 7, pp. 2214-2220, Jul. 2013 (7 pages).
Cartoixa et al., "Thermal Rectification by Design in Telescopic Si Nanowires," Nano Letters, vol. 15, Issue 12, pp. 8255-8259, Nov. 23, 2015 (5 pages).
Chaar et al., "Review of photovoltaic technologies," Renewable and Sustainable Energy Reviews, vol. 15, Issue 5, pp. 2165-2175, Jun. 2011 (11 pages).
Chang et al., "Solid-state thermal rectifier," Science, vol. 314, Issue 5802, pp. 1121-1124, Nov. 17, 2006 (6 pages).
Chao, Y, "Autonomous Underwater Vehicles and Sensors Powered by Ocean Thermal Energy," IEEE, 2016 (4 pages).
Chavez-Urbiola et al., "Solar hybrid systems with thermoelectric generators," Solar Energy, vol. 86, Issue 1, pp. 369-378, Jan. 2012 (10 pages).

(56) References Cited

OTHER PUBLICATIONS

Cheknane et al., "Performance of concentrator solar cells with passive cooling," Semiconductor Science and Technology, vol. 21, No. 2, pp. 144-147, 2006 (5 pages).
Chen et al., "Flexible thermal rectifier based on macroscopic PDMS@graphite composite film with asymmetric cone-shape interfaces," Carbon, vol. 126, pp. 464-471, Jan. 2018 (8 pages).
Chen et al., "Controllable Thermal Rectification Realized in Binary Phase Change Composites," Scientific Reports, vol. 5, Article No. 8884, 2015 (8 pages).
Chen et al., "Experimental and numerical study on melting of phase change materials in metal foams at pore scale," International Journal of Heat and Mass Transfer, vol. 72, pp. 646-655, May 2014 (10 pages).
Chen et al., "Three-dimensional flexible and conductive interconnected graphene networks grown by chemical vapour deposition," Nature Materials, vol. 10, pp. 424-428, 2011 (5 pages).
Chenlo et al., "A linear concentrator photovoltaic module: analysis of non-uniform illumination and temperature effects on efficiency," Solar Cells, vol. 20, Issue 1, pp. 27-39, Feb. 1987 (13 pages).
Cottrill et al., "Analysis of Thermal Diodes Enabled by Junctions of Phase Change Materials," Advanced Energy Materials, vol. 5, Issue 23, 2015 (10 pages).
Cottrill et al., "Dual Phase Change Thermal Diodes for Enhanced Rectification Ratios: Theory and Experiment," Advanced Energy Materials, vol. 8, Issue 11, Article No. 1702692, 2018 (11 pages).
Cottrill et al., "Persistent energy harvesting in the harsh desert environment using a thermal resonance device: Design, testing, and analysis," Applied Energy, vol. 235, pp. 1514-1523, Feb. 2019 (10 pages).
Cottrill et al., "Ultra-high thermal effusivity materials for resonant ambient thermal energy harvesting," Nature Communications, vol. 9, Feb. 2018 (11 pages).
Cuadras et al., "Thermal energy harvesting through pyroelectricity," Sensors and Actuators A: Physical, vol. 158, Issue 1, pp. 132-139, Mar. 2010 (8 pages).
Dalal et al., "Design considerations for high-intensity solar cells," Journal of Applied Physics, vol. 48, No. 3, pp. 1244-1251, Mar. 1977 (9 pages).
Dames, C, "Solid-State Thermal Rectification with Existing Bulk Materials," Journal of Heat Transfer, vol. 131, Issue 6, pp. 061301-1 through 061301-7, Jun. 2009 (7 pages).
Dhar et al., "Energy Harvesting and Storage: Materials, Devices, and Applications II," Proceedings of SPIE, vol. 8035, 2011 (351 pages).
El Chaar et al., "Review of photovoltaic technologies," Renewable and Sustainable Energy Reviews, vol. 15, Issue 5, pp. 2165-2175, Jun. 2011 (11 pages).
Elgafy et al., "Effect of carbon nanofiber additives on thermal behavior of phase change materials," Carbon, vol. 43, Issue 15, pp. 3067-3074, Dec. 2005 (8 pages).
Elzouka et al., "High Temperature Near-Filed NanoThermoMechanical Rectification," Scientific Reports, vol. 7, Article No. 44901, 2017 (8 pages).
Farid et al., "A review on phase change energy storage: materials and applications," Energy Conversion and Management, vol. 45, Issues 9-10, pp. 1597-1615, Jun. 2004 (19 pages).
Fiorino et al., "A Thermal Diode Based on Nanoscale Thermal Radiation," ACS Nano, vol. 12, Issue 6, pp. 5774-5779, May 2018 (6 pages).
Freeman et al., "An Assessment of Solar-Thermal Collector Designs for Small-Scale Combined Heating and Power Applications in the United Kingdom," Heat Transfer Engineering, vol. 36, Issues 14-15, pp. 1332-1347, 2015 (17 pages).
Gaddam et al., "A liquid-state thermal diode," International Journal of Heat and Mass Transfer, vol. 106, pp. 741-744, Mar. 2017 (4 pages).
Garcia-Garcia et al., "Thermal rectification assisted by lattice transitions," International Journal of Thermal Sciences, vol. 81, pp. 76-83, Jul. 2014 (8 pages).

Go et al., "On the condition for Thermal Rectification Using Bulk Materials," Journal of Heat Transfer, vol. 132, Issue 12, Article No. 124502, Sep. 2010 (15 pages).
Gu et al., "Asymmetric geometry composites arranged between parallel aligned and interconnected graphene structres for highly efficient thermal rectification," RSC Advances, vol. 7, pp. 10683-10687, 2017 (5 pages).
Muetze et al., "Ocean Wave Energy Conversion—A Survey," Conference Record of the 2006 IEEE Industry Applications Conference 41st IAS Annual Meeting, pp. 1410-1417, 2006 (8 pages).
Nakayama et al., "Thermal Rectification in Bulk Material Through Unusual Behavior of Electron Thermal Conductivity of Al—Cu—Fe Icosahedral Quasicrystal," Journal of Electronic Materials, vol. 44, Issue 1, pp. 356-361, Jan. 2015 (6 pages).
Narayana et al., "Heat Flux Manipulation with Engineered Thermal Materials," Physical Review Letters, vol. 108, Article No. 214303, May 2012 (5 pages).
Nguyen et al., "Pyroelectric energy converter using co-polymer P(VDF-TrFE) and Olsen cycle for waste heat energy harvesting," Applied Thermal Engineering, vol. 30, Issue 14-15, pp. 2127-2137, Oct. 2010 (11 pages).
Ni et al., "Thermal conductivity and thermal rectification in unzipped carbon nanotubes," Journal of Physics Condensed Matter, vol. 23, Article No. 215301, May 2011 (7 pages).
Ong et al., "Heat spreading and heat transfer coefficient with fin heat sink," Applied Thermal Engineering, vol. 112, pp. 1638-1647, Feb. 2017 (10 pages).
Paradiso et al., "Energy scavenging for mobile and wireless electronics," IEEE Pervasive Computing, vol. 4, pp. 18-27, 2005 (10 pages).
Peace et al., "Structure of high-internal-phase-ratio emulsions," Journal of Colloid and Interface Science, vol. 47, No. 2, pp. 416-423, May 1974 (8 pages).
Peyrard, M, "The design of a thermal rectifier," Europhysics Letters, vol. 76, No. 1, pp. 49-55, Aug. 2006 (8 pages).
Potnuru et al., "Characterization of pyroelectric materials for energy harvesting from human body," Intergrated Ferroelectrics, vol. 150, pp. 1-28, 2014 (29 pages).
Quoilin et al., "Performance and design optimization of a low-cost solar organic Rankine cycle for remote power generation," Solar Energy, vol. 85, Issue 5, pp. 955-966, May 2011 (12 pages).
Reuse et al., "Hydrogen production for fuel cell application in an autothermal micro-channel reactor," Chemical Engineering Journal, vol. 101, Issues 1-3, pp. 133-141, Aug. 2004 (9 pages).
Richardson et al., "An analysis of phase change material as thermal mass," Proceedings of the Royal Society London A Mathematical Physical and Engineering Sciences, vol. 464, pp. 1029-1056, 2008 (28 pages).
Roberts et al., "A review of thermal rectification observations and models in solid materials," International Journal of Thermal Sciences, vol. 50, Issue 5, pp. 648-662, May 2011 (15 pages).
Royne et al., "Cooling of photovoltaic cells under concentrated illumination: a critical review," Solar Energy Materials and Solar Cells, vol. 86, Issue 4, pp. 451-483, Apr. 2005 (33 pages).
Samson et al., "Flight test results of a thermoelectric energy harvester for aircraft," Journal of Electronic Materials, vol. 41, Issue 6, pp. 1134-1137, Jun. 2012 (4 pages).
Sari et al., "Microencapsulated n-octacosane as phase change material for thermal energy storage," Solar Energy, vol. 83, Issue 10, pp. 1757-1763, Oct. 2009 (7 pages).
Sarler, B, "Stefan's work on solid-liquid phase changes," Engineering Analysis with Boundary Elements, vol. 16, Issue 2, pp. 83-92, 1995 (10 pages).
Sawaki et al., "Thermal rectification in bulk materials with asymmetric shape," Applied Physics Letters, vol. 98, Article No. 081915, 2011 (4 pages).
Sebald et al., "Energy harvesting based on Ericsson pyroelectric cycles in a relaxor ferroelectric ceramic," Smart Materials and Structures, vol. 17, Article No. 015012, 2007 (7 pages).
Sebald et al., "On thermoelectric and pyroelectric energy harvesting," Smart Materials and Structures, vol. 18, Article No. 125006, Sep. 2009 (8 pages).

(56) References Cited

OTHER PUBLICATIONS

Sharaf et al., "Concentrated photovoltaic thermal (CPVT) solar collector systems: Part I—Fundamentals, design considerations and current technologies," Renewable and Sustainable Energy Reviews, vol. 50, pp. 1500-1565, Oct. 2015 (66 pages).
Shen et al., "A Dual-Port Triple-Band L-Probe Microstrip Patch Rectenna for Ambient RF Energy Harvesting," IEEE Antenna and Wireless Propagation Letters, vol. 16, pp. 3071-3074, 2017 (4 pages).
Shih et al., "Maximal rectification ratios for idealized bi-segment thermal rectifiers," Scientific Reports, vol. 5, Article. No 12677, Aug. 2015 (11 pages).
Singh, G. K., "Solar power generation by PV (photovoltaic) technology: A review," Energy, vol. 53, pp. 1-13, 2013 (13 pages).
Sorour et al., "Thermal conductivity and diffusivity of soil," International Communications in Heat and Mass Transfer, vol. 17, Issue 2, pp. 189-199, 1990 (11 pages).
Starr, C, "The copper oxide rectifier," Physics, vol. 7, pp. 15-19, 1936 (6 pages).
Stevens, J.W., "Optimal placement depth for air-ground heat transfer systems," Applied Thermal Engineering, vol. 24, Issues 2-3, pp. 149-157, Feb. 2004 (9 pages).
Stevens, J.W., "Performance factors for ground-air thermoelectric power generators," Energy Conversion and Management, vol. 68, pp. 114-123, Apr. 2013 (10 pages).
Takeuchi et al., "Development of a Thermal Rectifier Usable at High Temperature," Journal of Electronic Materials, vol. 40, No. 5, pp. 1129-1135, May 2011 (8 pages).
Takeuchi et al., "Improvement in rectification ratio of an Al-based bulk thermal rectifier working at high temperatures," Journal of Applied Physics, vol. 111, Article No. 093517, 2012 (8 pages).
Takeuchi, T, "Very large thermal rectification in bulk composites consisting partly of icosahedral quasicrystals," Science and Technology of Advanced Materials, vol. 15, Article No. 064801, Nov. 2014 (9 pages).
Terraneo et al., "Controlling the Energy Flow in Nonlinear Lattices: A Model for a Thermal Rectifier," Physical Review Letters, vol. 88, No. 9, Mar. 2002 (4 pages).
Tian et al., "A Novel Solid-State Thermal Rectifier Based on Reduced Graphene Oxide," Scientific Reports, vol. 2, Article No. 523, Jul. 23, 2012 (7 pages).
Tillman et al., "Meterology Data-Direct from Mars!" from: https://www-k12.atmos.washington.edu/k12/resources/mars_data-information/data.html.
Tso et al., "Solid-state thermal diode with shape memory alloys," International Journal of Heat and Mass Transfer, vol. 93, pp. 605-611, Feb. 2016 (7 pages).
Tsukamoto et al., "Micro thermal diode with glass thermal insulation structure embedded in a vapor chamber," Journal of Physics: Conference Series, vol. 476, 2013 (6 pages).
Tu et al., "Controllable growth of 1-7 layers of graphene by chemical vapour deposition," Carbon, vol. 73, pp. 252-258, Jul. 2014 (7 pages).
Vega, L.A., "Ocean thermal energy conversion," Encyclopedia of Sustainability Science and Technology, pp. 7296-7328, 2012 (33 pages).
Vélez et al., "Temperature-dependent thermal properties of solid/liquid phase change even-number3ed n-alkines: n-Hexadecane, n-octadecane and n-eicosane," Applied Energy, vol. 143, pp. 383-394, Apr. 2015 (12 pages).
Vorobiev et al., "Thermal-photovoltaic solar hybrid system for efficient solar energy conversion," Solar Energy, vol. 80, Issue 2, pp. 170-176, Feb. 2006 (7 pages).
Wang et al., "Experimental study of thermal rectification in suspended monolayer graphene," Nature Communications, vol. 8, Article No. 15843, Jun. 2017 (8 pages).
Wang et al., "A simple method for the estimation of thermal inertia," Geophysical Research Letters, vol. 37, No. L05404, Mar. 2010 (5 pages).

Wang et al., "Thermal logic gates: Computation with phonons," Physical Review Letters, vol. 99, Article No. 177208, Oct. 2007 (4 pages).
Wang et al., "Thermal Memory: A Storage of Phononic Information," Physical Review Letters, vol. 101, Article No. 267203, Dec. 29, 2008 (4 pages).
Wang et al., "Performance evaluation of a low-temperature solar Rankine cycle system utilizing R245fa," Solar Energy, vol. 84, Issue 3, pp. 353-364, 2009 (12 pages).
Wang et al., "Phonon Lateral Confinement Enables Thermal Rectification in Asymmetric Single-Material Nanostructures," Nano Letters, vol. 14, Issue 2, pp. 592-596, Jan. 2014 (5 pages).
Wang, Z.L., "Triboelectric Nanogenerators," Springer International Publishing Switzerland, 2016 (537 pages).
Wang, Z.L., "Triboelectric Nanogenerators as New Energy Technology for Self-Powered Systems and as Active Mechanical and Chemical Sensors," ACS Nano, vol. 7, No. 11, pp. 9533-9557, Sep. 2013 (25 pages).
Warburg, E, "Ueber das Verhalten sogenannter unpolarisirbarer Elektroden gegn Wechselstrom," annalen der physik, vol. 67, Issue 3, pp. 493-499, 1899 (7 pages).
Whalen et al., "Thermoelectric energy harvesting from diurnal heat flow in the upper soil layer," Energy Conversion and Management, vol. 64, pp. 397-402, Dec. 2012 (6 pages).
Wehmeyer et al., "Thermal diodes, regulators, and switches: Physical mechanisms and potential applications," Applied Physics Reviews, vol. 4, Article No. 041304, 2017 (33pages).
Westwood, M, "Master's thesis, Thermal Rectification to Increase Power and Efficiency of Solar-Thermal Electricity Seneration," University of California at Berkeley, 2015 (22 pages).
Wu et al., "Thermal rectification in carbon nanotube intramolecular junctions: Molecular dynamics calculations," Physics Review B, vol. 76, Article No. 085424, Aug. 2007 (8 pages).
Xia et al., "Preparation and thermal characterization of expanded graphite/paraffin composite phase change material," Carbon, vol. 48, Issue 9, pp. 2538-2548, Aug. 2010 (11 pages).
Xiao et al., "Effective thermal conductivity of open-cell metal foams impregnated with pure paraffin for latent heat storage," International Journal of Thermal Sciences, vol. 81, pp. 94-105, Jul. 2014 (12 pages).
Xiao et al., "Preparation and thermal characterization of paraffin/metal foam composite phase change material," Applied Energy, vol. 112, pp. 1357-1366, Dec. 2013 (10 pages).
Yang et al., "Carbon nanocone: A promising thermal rectifier," Applied Physics Letters, vol. 93, Article No. 243111, 2008 (4 pages).
Yang et al., "Thermal rectification in asymmetric graphene ribbons," Applied Physics Letters, vol. 95, Article No. 033107, 2009 (4 pages).
Yang et al., "Preparation and properties of myristic-palmitic-stearic acid/expanded graphite composites as phase change materials for energy storage," Solar Energy, vol. 99, pp. 259-266, Jan. 2014 (8 pages).
Ye et al., "Thermal rectification at the bimaterial nanocontact interface," Nanoscale, vol. 9, Issue 32, pp. 11480-11487, 2017 (8 pages).
Yidiz, F, "Potential Ambient Energy-Harvesting Sources and Techniques," Journal of Technology Studies, vol. 35, Issue 1, pp. 40-48, 2009 (9 pages).
Zalba et al., "Review on thermal energy storage with phase change: materials, heat transfer analysis and applications," Applied Thermal Engineering, vol. 23, Issue 3, pp. 251-283, Feb. 2003 (33 pages).
Zarr et al., "Standard Reference Materials: SRM 1453, Expanded Polystyrene Board, for Thermal Conductivity from 281 K to 313 K," NIST Special Publication, vol. 260, Issue 175, 2012 (65 pages).
Zhang et al., "A capric-palmitic-stearic acid ternary eutectic mixture/expanded graphite composite phase change material for thermal energy storage," Composites Part A: Applied Science and Manufacturing, vol. 87, pp. 138-145, Aug. 2016 (8 pages).
Zhang et al., "Concentrated solar power plants: Review and design methology," Renewable and Sustainable Energy Reviews, vol. 22, pp. 466-481, Jun. 2013 (16 pages).

(56) References Cited

OTHER PUBLICATIONS

Zhang et al., "A review of the composite phase change materials: Fabrication, characterization, mathematical modeling and application to performance enhancement," Applied Energy, vol. 165, pp. 472-510, Mar. 2016 (39 pages).

Zhang et al., "Giant Thermal Rectification from Polyethylene Nanofiber Thermal Diodes," Small, vol. 11, Issue 36, pp. 4657-4665, 2015 (9 pages).

Zhao, X, "Master's thesis, Thermal Diode Bridge Applied to Solar Energy Harvesting," University of California at Berkeley, 2015 (18 pages).

Zhou et al., "Vapor Chamber with Thermal Diode and Switch Functions," 2017 16th IEEE Intersociety Conference on Thermal and Thermomechanical Phenomena in Electronic Systems (ITHERM), pp. 521-528, 2017 (8 pages).

Zhu et al., "Temperature-Gated Thermal Rectifier for Active Heat Flow Control," Nano Letters, vol. 14, Issue 8, pp. 4867-4872, Jul. 2014 (6 pages).

Pallecchi, E et al., "A thermal diode and novel implementation in a phase-change material.", Materials Horizons, vol. 2, pp. 125-129, 2015.

Wang, L et al., "Phononics gets hot.", Physics World, vol. 21, Issue 3, p. 27-29, 2008.

Zhang, G et al., "Persistent, Single-Polarity Energy Harvesting from Ambient Thermal Fluctuations using a Thermal Resonance Device with Thermal Diodes." Applied Energy vol. 280, 115881, 11 pages, 2020.

\* cited by examiner

MATERIALS, DEVICES, AND METHODS FOR RESONANT AMBIENT THERMAL ENERGY HARVESTING USING THERMAL DIODES

CROSS REFERENCE TO RELATED APPLICATION

The present disclosure claims priority to U.S. Provisional Application No. 62/552,497, entitled "Energy Harvesting from Ambient Thermal Fluctuations using a Thermal Resonance Device," which was filed on Aug. 31, 2017, and which is incorporated by reference herein in its entirety.

GOVERNMENT RIGHTS

This invention was made with Government support under Grant No. FA9550-09-0700 awarded by the Air Force Office of Scientific Research. The Government has certain rights in the invention.

FIELD

The present disclosure relates to materials, devices, and methods for resonant ambient energy harvesting using thermal diodes, and more particularly relates to optimal constructions of thermal diodes for translating temperature fluctuations for a target frequency of temperature oscillations into a single polarity temperature difference for power extraction.

BACKGROUND

Research interest in ambient energy harvesting techniques has experienced rapid growth in recent years. Due to the recent trend in the global marketplace towards continuous miniaturization of electronics, there is substantial interest in developing renewable energy technologies that can be used to power these devices as reliance on batteries to power electronics applications becomes considerably less feasible. The manipulation of heat flux, in a manner similar to what is possible with electron flux, holds considerable promise for ambient energy harvesting, energy conservation, as well as for phononics or information processing, such as thermal logic gates, thermal memory, thermal circuits, and computation. However, high-performance, non-linear circuit elements for thermal energy do not yet exist in the way they exist for electrical energy.

A thermal diode, which is a thermal analog to an electrical diode, is a non-linear heat transfer element with a preferential direction for heat flow. Thermal diodes, or thermal rectifiers, can be critical components in the field of phononics, which focuses on controlling heat—phonons—for applications including heat management, thermal logic, thermal memory, and, thermal energy harvesting. However, manufacture of thermal diodes is currently difficult as there are limited constituent materials available for a given target temperature, particularly near ambient. Further, because the basis of operation of thermal diodes, which transport heat largely by a broad spectrum of difficult-to-control, high frequency phonons, is mechanistically very different from their electrical counterparts, approaches for constructing electrically rectifying circuits are not directly adaptable for thermal diode circuit construction.

Energy harvesting technologies span across a wide variety of size and power, ranging from macro-scale, e.g., utility-scale electrical grids (Giga to Mega Watts), to micro-scale, e.g., providing the power for miniaturized electronics (Nano to Micro Watts). The primary characteristics and motivations for macro-scale energy harvesting and micro-scale energy harvesting can differ considerably. For example, often some of the most crucial aspects of macro-scale energy harvesting include "total power," "efficiency," "stability," and "cost," while "availability," "efficiency," and "stability" are often some of the most crucial to nano or micro-scale energy harvesting. The development of macro-scale energy harvesting technologies has been heavily motivated by environmental concerns, while the increasing trend towards electronic miniaturization has made the sole reliance on battery power impractical and has, thus, been the primary driving force behind the development of nano and micro-scale energy harvesting technologies. Energy harvesting from solar, wind, waves, geothermal gradients, and oceanic thermal gradients via a variety of techniques has been applied for macro-scale energy harvesting. On the other hand, an ever-increasing variety of energy harvesting technologies has been developed for powering of miniaturized electronics, including: vibrational and motion-related harvesting using piezoelectrics and triboelectrics, static and dynamic thermal energy harvesting using thermoelectrics and pyroelectrics, radio frequency harvesting, and solar harvesting.

The first nano-scale, solid-state thermal diode was experimentally demonstrated by using an asymmetrically mass-loaded nanotube. Other nano-scale thermal diodes have been designed using graphene, as well as anisotropic nanomaterials such as carbon nanotubes, and Si nanowires. However, such nano-scale devices still present challenges for practical fabrication and exhibit poor thermal rectification ratios—the ratio of the forward ($q_f$) and reverse ($q_r$) heat flux magnitudes at steady state for thermal diodes operating under forward and reverse temperature biases of the same magnitude ($\geq 1$), e.g., lower than 1.08 experimentally. Further, solid-state, bulk thermal diodes, and theoretical studies that present promising strategies for making high-performance, solid-state thermal diodes that include materials with temperature dependent thermal conductivities, have shown promise as thermal diodes. For example, cobalt oxide-based thermal diodes capable of operation at about 40 K to about 100 K with a thermal rectification as high as approximately 1.43, thermal diodes made from Al—Cu—Fe icosahedral quasicrystal capable of operation at about 300 K to about 900 K and about 300 K to about 1000 K with rectifications of approximately 1.65 and approximately 1.63, respectively, and high temperature thermal diodes using Al-based metallic alloys capable of operation at about 300 K to about 1000 K with a rectification of approximately 1.07, have been fabricated experimentally and in practice. However, such solid-state materials with temperature dependent thermal conductivity are quite limited in species, and most of them are efficient only at temperatures lower than about 200 K or higher than about 400 K, both of which present difficulties for constructing a room temperature, solid-state thermal diode. In light of these limitations, the adoption of thermal diodes to efficiently harvest thermal energy is lacking.

A further limitation of technologies for harvesting energy from temperature fluctuations is the dual polarity nature of the output voltage ($\mu V$ to mV, due to low-grade temperature differences) of such energy harvesting devices and systems. Use of these energy harvesting devices and systems can necessitate electrical rectification of the output voltage to be routed to an entity for energy storage, which can result in inefficient power expenditures. Despite the durability and stability exhibited by such devices, these devices can operate with heavy energy losses than are experienced in the electrical circuits, e.g., efficiencies of about 30% to about 40%, due, at least in part, to the need to rectify these voltages. Further, energy harvesting devices are typically unable to capture large amplitude temperature fluctuations, and thus do not attain optimum performance outputs.

Accordingly, there is a need for durable energy harvesting techniques that are not limited by intermittency, and are capable of persistent and continuous operation over extended periods of time in a variety of environments. There is a further need for significant enhancements in the performance and efficiency of thermal energy harvesting concepts and devices, including moving away from dual polarity voltage outputs and are capable of capturing large amplitude temperature fluctuations.

SUMMARY

The present disclosure relates to the use of non-linear heat transfer elements (e.g., thermal diodes) to generate power or electrical energy. The non-linear heat transfer elements can be incorporated into energy harvesting devices, such as thermal resonance devices or resonators, to translate ambient temperature fluctuations from an environment surrounding the non-linear heat transfer elements into electrical energy having a single polarity voltage output. The non-linear heat transfer elements have a preferential direction for heat flow. For example, the heat flow can be from one thermal diode, towards an energy conversion component (e.g., a heat engine), and then from the energy conversion component to a second thermal diode. The diodes themselves can have thermal diffusion time scales. For example, each diode can include two thermal diffusion time scales, with one such time scale being a forward thermal diffusion time scale and the other such time scale being a backwards thermal diffusion time scale.

A number of parameters can be used to help optimize the performance of the non-linear heat transfer elements, and thus the energy harvesting devices themselves. For example, the sizes and thermal diffusivities of the non-linear heat transfer elements can be optimized for large electrical energy generation. Likewise, parameters such as a thermal rectification value of the energy harvesting devices, a dimensionless parameter of frequency oscillations of the energy harvesting devices, a dimensionless parameter related to an onset of thermal rectification of the energy harvesting devices, and/or a ratio of a thermal resistance of a linear thermal mass of the energy harvesting devices to a mean thermal resistance of one of the thermal diodes of the energy harvesting devices can be optimized for large electrical energy generation. The diodes themselves can include a junction of a phase-change material and a phase-invariant material. For example, the phase-change material can include poly(methyl methacrylate) and an octadecane-based paraffin-polystyrene foam hybrid.

The electrical energy and power generated by the energy harvesting devices can be used by the energy harvesting devices themselves, used by components, objects, or the like associated with the energy harvesting devices, and/or stored for subsequent use by any of the energy harvesting devices themselves, components, objects, or the like associated with the energy harvesting devices, and/or some other component, object, or the like that requires electrical energy or power to operate.

In one exemplary embodiment of an energy harvesting device, the device includes a first thermal diode, a second thermal diode, and a heat engine disposed between the first and second thermal diodes. Each of the first and second thermal diodes have a preferential direction for heat flow, the first and second preferential directions for heat flow, respectively, and the heat engine is configured to translate a spatial temperature difference between the first thermal diode and the second thermal diode into power. The spatial temperature difference has a single polarity across the heat engine. Further, the first preferential direction for heat flow is towards the heat engine and the second thermal diode, and the second preferential direction for heat flow is away from the heat engine and the first thermal diode.

The first thermal diode can include both a first thermal diffusion time scale and a second thermal diffusion time scale, and the second thermal diode can include both a third thermal diffusion time scale and a fourth thermal diffusion time scale. At least one of the first or second thermal diodes is tuned based on the respective first or second thermal diffusion time scales or the third or fourth thermal diffusion time scales such that the single polarity temperature difference exists between at least one of: (1) the first or second thermal diffusion time scales; or (2) the third or fourth thermal diffusion time scales. In some such embodiments, one of the first and second thermal diffusion time scales can include a forward thermal diffusion time scale, with the other of the first and second thermal diffusion time scales including a backwards thermal time scale Likewise, one of the third and fourth thermal diffusion time scales can include a forward thermal diffusion time scale, with the other of the third and fourth thermal diffusion time scales including a backwards thermal time scale. The first thermal diffusion time scale can be in a same direction as the third thermal diffusion time scale, and the second thermal diffusion time scale can be in a same direction as the fourth thermal diffusion time scale.

At least one of the first or second diffusion time scales can be controlled by at least one of a size of the first thermal diode or a thermal effusivity of the first thermal diode. Likewise, at least one of the third or fourth diffusion time scales can be controlled by at least one of a size of the second thermal diode or a thermal effusivity of the second thermal diode. In some embodiments, at least one of the first, second, third, or fourth diffusion time scales can be controlled by at least one of: (1) a thermal rectification value of the energy harvesting device; (2) a dimensionless parameter of frequency oscillations of the energy harvesting device; (3) a dimensionless parameter related to an onset of thermal rectification of the energy harvesting device; or (4) a ratio of a thermal resistance of a linear thermal mass of the energy harvesting device to a mean thermal resistance of one of the first and second thermal diodes. For example, the diffusion time scale(s) can be controlled by either or both of the thermal rectification value of the energy harvesting device and the dimensionless parameter related to an onset of thermal rectification of the energy harvesting device. The dimensionless parameter related to an onset of thermal rectification of the energy harvesting device can include a sharpness of a change in thermal conductivity for the first and second thermal diodes.

The first and second thermal diodes can have a preferential direction for heat flow such that the diodes dynamically rectify ambient temperature fluctuations and translate them into single polarity voltages across the heat engine. In some such embodiments, the first thermal diode can direct heat towards the heat engine and the second thermal diode can direct heat away from the heat engine. Each of the first and second thermal diodes can be configured to reach steady state when the spatial temperature difference between the first and second thermal diodes is translated into power.

The first and/or second thermal diodes can include a junction of a phase-change material and a phase-invariant material. For example, the phase-change material can include poly(methyl methacrylate) and an octadecane-based paraffin-polystyrene foam hybrid. A value of Young's Modulus for the octadecane-based paraffin-polystyrene foam hybrid can be about 11.5 MPa or greater.

In some embodiments, the energy harvesting device can also include a first thermal mass and a second thermal mass. The first thermal mass can be disposed between the first thermal diode and the heat engine such that the first thermal diode interfaces with an external boundary of the first thermal mass and forms a first external boundary of the energy harvesting device. Similarly, the second thermal mass can be disposed between the second thermal diode and the heat engine such that the second thermal diode interfaces with an external boundary of the second thermal mass and forms a second external boundary of the energy harvesting device.

The energy harvesting device can include a monitor that is in communication with the energy harvesting device and is configured to acquire data related to at least one of the energy harvesting device or an environment surrounding the energy harvesting device. The device can further include a microprocessor that can be configured to adjust one or more parameters of at least one of the energy harvesting device or the environment surrounding the energy harvesting device in response to the data acquired by the monitor.

Another exemplary embodiment of an energy harvesting device includes a first non-linear heat transfer element, a second non-linear heat transfer element, and an energy conversion component that is disposed between the first and second non-linear heat transfer elements. The energy conversion component is configured to translate ambient temperature fluctuations from an environment surrounding the first and second non-linear heat transfer elements into electrical energy having a single polarity voltage output.

In some embodiments, the first non-linear heat transfer element can include a first thermal diode and the second non-linear heat transfer element can include a second thermal diode. The ambient temperature fluctuations can include a temperature gradient across the first and/or second non-linear heat transfer elements. The temperature gradient can include a forward temperature bias or a reverse temperature bias.

An amount of electrical energy output by the energy harvesting device can be controlled by at least one of a size of at least one of the first or second non-linear heat transfer elements or a thermal effusivity of at least one of the first or second non-linear heat transfer elements. Alternatively, or additionally, an amount of electrical energy output by the energy harvesting device can be controlled by at least one of: (1) a thermal rectification value of the energy harvesting device; (2) a dimensionless parameter of frequency oscillations of the energy harvesting device; (3) a dimensionless parameter related to an onset of thermal rectification of the energy harvesting device; or (4) a ratio of a thermal resistance of a linear thermal mass of the energy harvesting device to a mean thermal resistance of one of the first and second non-linear heat transfer elements. For example, the diffusion time scale(s) can be controlled by either or both of the thermal rectification value of the energy harvesting device and the dimensionless parameter related to an onset of thermal rectification of the energy harvesting device. The dimensionless parameter related to an onset of thermal rectification of the energy harvesting device can include a sharpness of a change in thermal conductivity for the first and second non-linear heat transfer elements.

The first and second non-linear heat transfer elements can have a preferential direction for heat flow such that the non-linear heat transfer elements dynamically rectify ambient temperature fluctuations and translate them into single polarity voltages across the energy conversion component. In some such embodiments, the first non-linear heat transfer element can direct heat towards the energy conversion component and the second non-linear heat transfer element can direct heat away from the energy conversion component. Each of the first and second non-linear heat transfer elements can be configured to reach steady state when the energy conversion component translates the ambient temperature fluctuations from the environment surrounding the first non-linear heat transfer element and the second non-linear heat transfer element into electrical energy having a single polarity voltage output.

The first and/or second non-linear heat transfer elements can include a junction of a phase-change material and a phase-invariant material. For example, the phase-change material can include poly(methyl methacrylate) and an octadecane-based paraffin-polystyrene foam hybrid. A value of Young's Modulus for the octadecane-based paraffin-polystyrene foam hybrid can be about 11.5 MPa or greater.

In some embodiments, the energy harvesting device can also include a first thermal mass and a second thermal mass. The first thermal mass can be disposed between the first non-linear heat transfer element and the energy conversion component such that the first non-linear heat transfer element interfaces with an external boundary of the first thermal mass and forms a first external boundary of the energy harvesting device. Similarly, the second thermal mass can be disposed between the second non-linear heat transfer element and the energy conversion component such that the second non-linear heat transfer element interfaces with an external boundary of the second thermal mass and forms a second external boundary of the energy harvesting device.

The energy conversion component can include a heat engine. Alternatively, the energy conversion component can include a thermoelectric.

The energy harvesting device can include a monitor that is in communication with the energy harvesting device and is configured to acquire data related to at least one of the energy harvesting device or an environment surrounding the energy harvesting device. The device can further include a microprocessor that can be configured to adjust one or more parameters of at least one of the energy harvesting device or the environment surrounding the energy harvesting device in response to the data acquired by the monitor.

An exemplary method of harvesting energy includes operating a thermal resonance device to translate a spatial temperature difference between two thermal diodes into electrical energy having a single polarity voltage output.

In some embodiments, operating a thermal resonance device can include causing a heat flow to travel from a first thermal diode of the two thermal diodes, towards an energy conversion component disposed between the two thermal diodes, and from the energy conversion component towards a second thermal diode of the two thermal diodes. The energy conversion component can include a heat engine. Alternatively, the energy conversion component can include a thermoelectric. Operating a thermal resonance device can include causing each of the two thermal diodes to reach steady state when the spatial temperature difference between the two thermal diodes is translated into electrical energy.

The energy harvesting method can further include causing at least a portion of the electrical energy that results from translating a spatial temperature difference between two thermal diodes into electrical energy having a single polarity voltage output to be stored. Alternatively, or additionally, the energy harvesting method can further include causing at least a portion of the power that results from translating a spatial temperature difference between two thermal diodes into electrical energy having a single polarity voltage output to be used to at least one of power one or more components of an object or system associated with the thermal resonance device. In some embodiments, the method can include placing the thermal resonance device in an environment subject to an ambient temperature fluctuation.

At least one of the two thermal diodes can include a junction of a phase-change material and a phase-invariant material. For example, the phase-change material can include poly(methyl methacrylate) and an octadecane-based paraffin-polystyrene foam hybrid. A value of Young's Modulus for the octadecane-based paraffin-polystyrene foam hybrid can be about 11.5 MPa or greater.

In some embodiments, the method can include determining a performance factor of at least one thermal diode of the thermal resonance device and optimizing the amount of electrical energy that is outputted by the thermal resonance device in view of the determined performance factor. Alternatively, or additionally, the method can include optimizing the amount of electrical energy that is outputted by the thermal resonance device by adjusting at least one of: (1) a thermal rectification value of the energy harvesting device; (2) a dimensionless parameter of frequency oscillations of the energy harvesting device; (3) a dimensionless parameter related to an onset of thermal rectification of the energy harvesting device; or (4) a ratio of a thermal resistance of a linear thermal mass of the energy harvesting device to a mean thermal resistance of one of the first and second non-linear heat transfer elements. For example, optimizing the amount of electrical energy that is outputted by the thermal resonance device can involve adjusting either or both of the thermal rectification value of the thermal resonance device and the dimensionless parameter related to an onset of thermal rectification of the thermal resonance device. The dimensionless parameter related to an onset of thermal rectification of the thermal resonance device can include a sharpness of a change in thermal conductivity for at least one of the two thermal diodes.

The method can further include operating a monitor to acquire data related to the thermal resonance device and/or the environment. One or more parameters of the thermal resonance device and/or the environment can be caused to be adjusted in view of the acquired data.

BRIEF DESCRIPTION OF DRAWINGS

This disclosure will be more fully understood from the following detailed description taken in conjunction with the accompanying drawings, in which.

DETAILED DESCRIPTION

Figure 1:
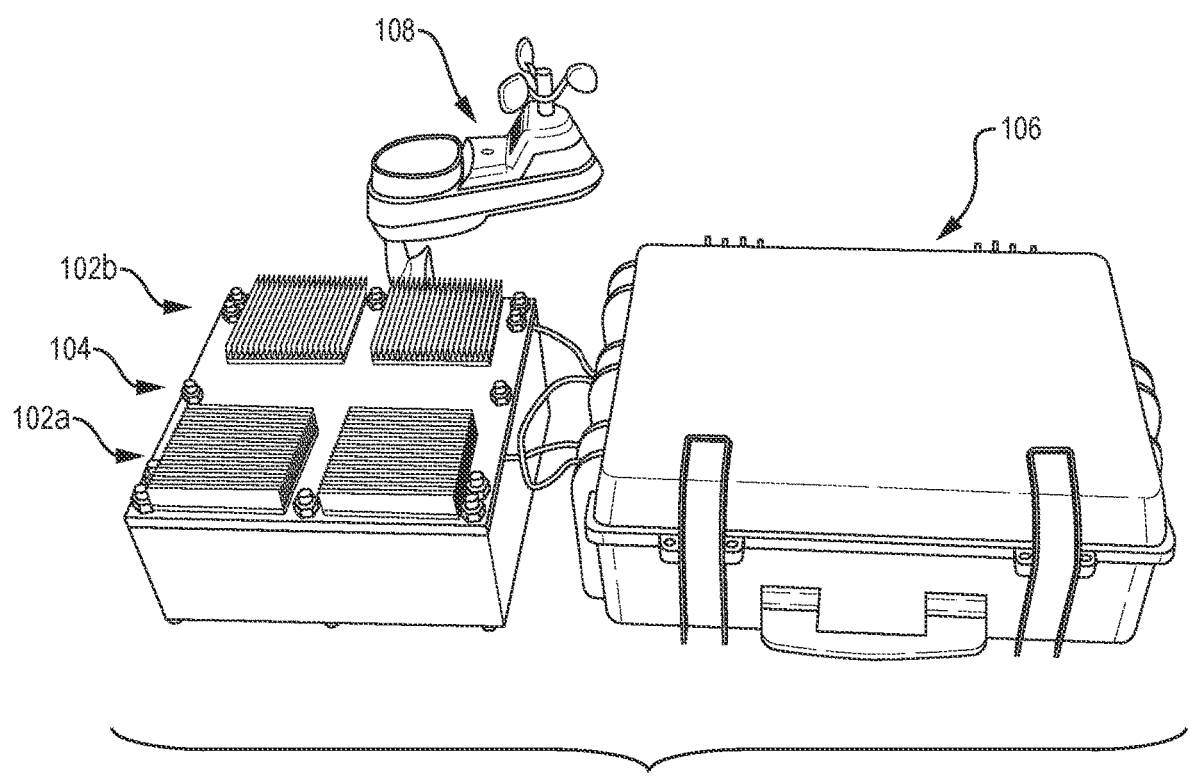
FIG. 1 is a perspective view of one exemplary embodiment of a thermal resonance device coupled to a monitor.

Certain exemplary embodiments will now be described to provide an overall understanding of the principles of the structure, function, manufacture, and use of the materials, devices, and methods disclosed herein. One or more examples of these embodiments are illustrated in the accompanying drawings. Those skilled in the art will understand that the materials, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, to the extent features, sides, or steps are described as being "first" or "second," such numerical ordering is generally arbitrary, and thus such numbering can be interchangeable. Still further, in the present disclosure, like-numbered components of various embodiments generally have similar features when those components are of a similar nature and/or serve a similar purpose.

It will be appreciated that, for convenience and clarity, spatial terms such as "top," "bottom," "up," and "down," may be used herein with respect to the drawings. However, these systems can be set-up using various orientations and positions, and these terms are not intended to be limiting and/or absolute. To the extent that linear or circular dimensions are used in the description of the disclosed materials, devices, and methods, such dimensions are not intended to limit the types of shapes that can be used in conjunction with such materials, devices, and methods. A person skilled in the art will recognize that an equivalent to such linear and circular dimensions can easily be determined for any geometric shape. Further, the terms "in" and "on" may be used interchangeably to describe forming a particular configuration (e.g., placing or embedding a thermal resonance device) with respect to an existing thermal mass, and a person skilled in the art will recognize that usage of one of the terms "in" and "on" can cover both "in" and "on." Additionally, a number of different terms can be used interchangeably while still being understood by the skilled person. By way of non-limiting example, the terms "thermal resonators" and "thermal resonance devices" are generally used interchangeably, as are the terms "thermal fluctuations" and "temperature fluctuations," and "power" and "electrical energy," with the understanding that the electrical energy is provided over a period of time, among others. Moreover, the concepts of "linear thermal resonator" and "thermal resonator with linear thermal masses" (or "resonance devices" in place of "resonator" as indicated above) are generally used interchangeably such that one skilled in the art will recognize that they are intended to refer to a resonator/resonance device having linear masses and devoid of thermal diodes. Further, the present disclosure includes some illustrations and descriptions that include prototypes, bench models, and/or models having an experimental basis. A person skilled in the art will recognize how to rely upon the present disclosure to integrate the techniques, materials, devices, and methods provided for into a product and/or real world use (e.g., adapting equations from an experimental model for use in a thermal resonance device that includes thermal diodes) in view of the present disclosures. The skilled person will recognize that there may be some performance loss and/or other changes to the way experimental models provided for herein perform in reality, but the present disclosures nevertheless support implementations of the models in reality (e.g., as an actual device, product, etc.).

General Overview of Present Disclosure

The present disclosure generally relates to materials, devices, and methods for generating electrical energy from ambient thermal energy. An energy harvesting technique of particular interest for the powering of miniaturized electronics, and even larger scale applications, is the concept of thermal resonance devices, also referred to herein as thermal resonators, that capture energy from ambient thermal fluctuations of various frequencies. The resonators are transient thermal energy harvesting devices that convert ubiquitous ambient temperature fluctuations into electricity. The energy harvested by the thermal resonators can produce a steady, persistent power output. Thermal resonators can be durable and stable energy harvesters, especially for remote locations. In some embodiments, thermal resonators can employ linear heat transfer elements and/or high thermal effusivity materials to convert ambient temperature fluctuations into a dual polarity temperature difference across a solid-state heat engine or thermoelectric for dual polarity electricity generation, as discussed in U.S. patent application Ser. No. 16/120, 114, entitled "Material, Devices, and Methods for Resonant Ambient Thermal Energy Harvesting," of Michael S. Strano et al., filed on an even date herewith, and now issued as U.S. Pat. No. 11,296,271, the disclosure of which is incorporated by reference herein in its entirety.

In accordance with the present disclosures, thermal resonators can also incorporate non-linear heat transfer elements, such as thermal diodes, in addition to, and/or in lieu of high thermal effusivity materials to enhance thermal resonator performance. In some embodiments, the thermal diodes can be formed from a junction of a phase-change material and a phase invariant material. The thermal diodes can interface with external boundaries of the resonator to enable operation at ambient temperatures. The diodes are able to directly capture and transform ubiquitous temperature fluctuations into single polarity voltages and bypass a dual polarity voltage output. That is, in view of the single polarity voltage design provided for by the present disclosure, circuitry typically required for electrical rectification in a dual polarity set-up can be bypassed.

The diodes can be tunable to enhance efficiency and outperform linear thermal resonators. For example, the incorporation of the thermal diodes into the resonator can allow for a dynamic rectification of temperature fluctuations into a single polarity temperature difference across a heat engine or thermoelectric for power extraction. The heat engine and thermoelectric are examples of energy conversion components, with thermoelectrics having lower conversion efficiencies than larger heat engines, while being compact, portable, and sufficiently powerful to power a range of small devices, e.g., sensors. The thermal diodes can dynamically rectify these temperature fluctuations and translate them into single polarity voltages. The voltages achieved by these single polarity configurations can drastically exceed the voltages achieved by thermal resonators that utilize a dual polarity configuration. The single polarity temperature difference can be caused by ambient temperature fluctuation amplitudes and frequencies that activate thermal rectification. In some embodiments, the thermal diodes can be tuned for a target temperature fluctuating environment having the capacity to generate broadband thermal resonators that are capable of a wide spectrum of frequency inputs and drastically outperform thermal resonators in the absence of thermal diodes. The configurations for thermal resonators that incorporate non-linear heat transfer elements allow for persistent and continuous operation over extended periods of time, e.g., about 5 years, about 10 years, or about 20 or more years.

By way of further example, the thermal diodes can be applied to transient energy harvesting to construct a thermal resonance circuit. The thermal resonance circuit can include a thermal diode bridge capable of ambient energy harvesting. One skilled in the art will appreciate that the thermal diode bridge is an analog to the electrical diode bridge circuit with implications for transient thermal energy harvesting and conservation, as well as thermal information processing.

Thermal Resonance Devices

FIG. 1 illustrates one exemplary embodiment of a thermal resonance device, or resonator, 100 capable of harvesting energy from ambient temperature fluctuations. One skilled in the art will recognize that the environment can include an abundance of fluctuating temperature waveforms of various frequencies and magnitudes under ambient conditions that can be harvested for energy. For example, the diurnal temperature cycle can be an ubiquitous source for thermal energy harvesting. The diurnal temperature cycle is highly persistent in a variety of environments worldwide with amplitudes of approximately 10° C. and median temperatures depending on the geographical location. Moreover, diurnal temperature fluctuations, e.g., 10 μHz, extend both below ground and beyond earth, with these fluctuations having important possibilities for energy harvesting in space applications.

By way of further example, movement-induced temperature fluctuations, e.g., altitude, sea depth, and so forth, can also be an ubiquitous source for energy harvesting. The existence of low-grade temperature gradients throughout the environment, when coupled with motion, can create a variety of temperature fluctuations for energy harvesting. Some non-limiting examples of movement-induced temperature fluctuations can include atmospheric lapse rate with respect to altitude for a drone in flight, e.g., temperature fluctuation amplitudes of approximately 1° C. at altitudes less than approximately 100 meters, atmospheric lapse rate for an aircraft in flight, e.g., temperature fluctuation amplitudes of approximately 30° C. for altitudes up to approximately 7500 meters, and a Bluetooth-enabled temperature sensor of a cell phone, e.g., temperature fluctuations centered around approximately 27° C. and characterized by an amplitude of approximately 10° C.

One skilled in the art will appreciate that the thermal resonator 100 can be added to a variety of structures. For example, in some embodiments the thermal resonator 100 can provide energy to outdoor structures, such as boats, bridges, benches, and street or sidewalk lights, as well as underground structures, such as pipes and tunnel boring machines. In the case of underground structures or underwater machinery, such as a glider or a submarine, it can be useful for the thermal resonator 100 to include a battery or a capacitor (not shown) for storing energy after conversion, although the incorporation of an energy storing component can be utilized in any configuration or set-up. The stored energy can then be utilized when the structure is underground, underwater, or such that it is otherwise not being exposed to ambient thermal fluctuations to generate energy. In embodiments in which the thermal resonator may be the only source of energy, the capacitor can store and release the energy to continue to power the structure during operation. In some embodiments, the thermal resonators can be added to structures exposed to harvest thermal fluctuations of large magnitudes, e.g., satellites and space stations. In some embodiments, the energy generated by the thermal resonator can be used to charge batteries.

The thermal resonator shown in FIG. 1 includes two thermal components, as shown two masses 102a, 102b, separated by a heat engine 104, e.g., a plurality of thermoelectric modules, although in some instances a single module can be used, with the masses being exposed to an ambient temperature profile. Although the illustrated embodiment does not include thermal diodes, alternative embodiments could include diodes of the nature provided for herein in lieu of, or in addition to, the thermal masses 102a, 102b. The first and second masses 102a, 102b can be configured to capture the ambient thermal fluctuations and, using the heat engine 104, translate a resulting spatial temperature difference into electrical energy. The efficiency with which the masses 102a, 102b can capture the thermal fluctuations can be determined by the frequency to which they are tuned, as described further below. In some embodiments, the thermal masses 102a, 102b can be tuned to the dominant frequency of the temperature fluctuations to capture maximum amounts of temperature fluctuations to yield larger power outputs. When tuned to the dominant frequency of the fluctuations, the energy can be generated on a substantially persistent basis such that the thermal resonator can generate heating and/or cooling throughout the cycles of the day. Generating energy on a substantially persistent basis can refer to the power output being persistently non-zero throughout the energy harvesting period, except at two points of the day when the cycles switch from heating to cooling and vice versa, during which time no power output is generated.

In some embodiments the thermal resonator 100 can include a monitor 106. The monitor 106 can include one or more sensors (not shown) to track thermal temperature fluctuations, ambient temperature, and power output, among other data, parameters, and information known to those having skill in the art to be useful and/or desirable to obtain in view of the present disclosures. The monitor 106 can be affixed to the thermal resonator 100 or placed external to the resonator to acquire measurements to which the thermal resonator is exposed. In some embodiments, the monitor 106 can be positioned on the resonator 100, or otherwise associated with the resonator to allow it to gather data and information as desired. In some embodiments, the monitor 106 can be in the form of a data acquisition board. Some non-limiting examples of data acquisition boards can include a DrDAQ or a LabJack data acquisition board that is in electrical communication with the thermal resonator. The data acquisition board can be in communication with the thermal resonator 100 using one or more wires 120 to carry signals therebetween. Alternative measures can also be used for data transfer, including electrical, digital, optical, and wireless communications. Further, in some embodiments, microprocessors can be employed for data collection, the microprocessors being configured to receive the data from the data transfer, which can in turn be used to quantify thermal resonator performance, among other features. Based on the data received by the microprocessor, and/or used by the microprocessor to make determinations about the performance of the thermal resonator 100 (e.g., a quantified thermal resonator performance, as provided for herein or otherwise derivable from the present disclosures) and/or the surrounding environment, the microprocessor can help operate or otherwise be a part of a feedback loop. The feedback loop can use the determinations made by the microprocessor to alter one or more parameters of the device and/or the surrounding environment to achieve a desired result (e.g., improved performance, achieving a particular voltage output, etc.). Although a microprocessor is described as being part of a feedback loop, a person skilled in the art will recognize other systems and devices that can be incorporated into a feedback loop that can achieve the same purposes—that is, to utilize data to improve performance of the thermal resonator 100.

In some embodiments the monitor 106 can be coupled to a data collector 108, e.g., a weather station, as shown. The data collector 108 can be in communication with the resonator 100 and/or the monitor 106 to gather data that is fed to the monitor for analysis. Some non-limiting examples of data collected by the data collector can include solar-related data, wind-related data, rain-related data, temperature, and other information and/or data about the ambient environment, e.g., the diurnal cycle, to which the resonator is exposed. The data collector 108 can be affixed to the thermal resonator 100 or placed external to the resonator, as shown, to acquire measurements to which the thermal resonator is exposed. In one non-limiting embodiment, the data collector 108 includes an AcuRite 02064 Wireless Weather Station with PC Connect can be in electrical communication with the thermal resonator 100. A person skilled in the art will recognize many other data collectors that can be used in conjunction with the thermal resonator 100, as well as other thermal resonators provided for herein or otherwise derivable from the present disclosures.

Methods of Manufacturing Thermal Diodes

Figure 2:
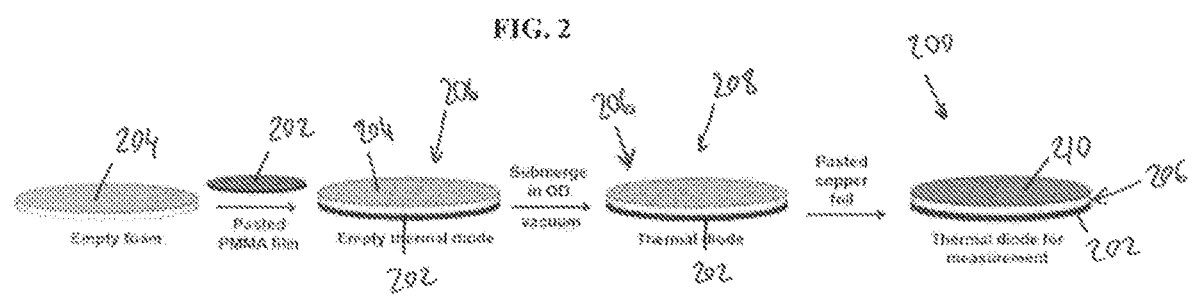
FIG. 2 is a schematic perspective view of one exemplary embodiment of making a thermal diode.

FIG. 2 illustrates one non-limiting example of a general schematic illustrating how a phase-change thermal diode 200 can be manufactured for use in conjunction with thermal resonance devices. A thermal diode is a non-linear heat transfer element with a preferential direction for heat flow. It is the thermal analog to an electrical diode. The thermal diode, or thermal rectifier, 200 is one example of a nonlinear heat transfer element that can be used in conjunction with the thermal resonance devices provided for herein or otherwise derivable from the present disclosures. Although FIG. 2 provides for a phase-change thermal diode 200, a person skilled in the art, in view of the present disclosures, will recognize many other thermal diode configurations, and thus the illustration and use of a phase-change material(s) is by no means limiting.

Performance of the thermal diode 200 (Q), or thermal diodes more generally, can be quantified as the ratio of the magnitudes of the forward ($J_f$) and reverse ($J_r$) steady state heat fluxes, and it can be termed the thermal rectification ratio, as shown in Equation (1):

$$Q = \frac{|J_f|}{|J_r|} \quad (Q \neq 1) \tag{1}$$

One skilled in the art will recognize that in some embodiments the thermal rectification ratio can be quantified as the ratio of the magnitudes of the reverse ($J_r$) and forward ($J_f$) steady state heat fluxes to quantify thermal diode performance (Q). It will be appreciated that when Q=1, the performance no longer applies to diodes but rather to linear thermal elements, as discussed in the patent application entitled "Material, Devices, and Methods for Resonant Ambient Thermal Energy Harvesting," of Michael S. Strano et al. that is incorporated by reference above. Thermal rectification is the action of converting a time and directionally varying heat flux into a single polarity temperature gradient. In some embodiments, the phase-change thermal diode 200 can be formed at an interface, or junction, of a phase invariant material (material A) and a phase-change material (material B). Phase-change materials can be attractive building blocks for thermal diodes due to their ability to perform rapid thermal conductivity modulation over short temperature ranges near ambient temperatures in response to its phase-change. For example, the phase-change thermal diode can include poly(methyl methacrylate) (PMMA) (material A) and an octadecane-based paraffin-polystyrene foam hybrid (PFH-O) (material B). It will be appreciated that performance of the thermal diode(s) improves if one or more of the phase-change material and a phase invariant material are capable of robust operation at ambient temperatures. For example, one skilled in the art will recognize that octadecane can be a strong main phase-change material due to its phase transition near ambient conditions, which can enable thermal diode activation at ambient temperatures. Ambient thermal elements can be more amenable to typical energy applications such as thermal energy harvesting, management, and conservation.

By way of further example, paraffins and the paraffin-polystyrene foam hybrid (PFH) discussed above, is similarly well-suited for thermal diodes. Paraffins are a class of phase-change materials with transition points near room temperature and can be both suitable and convenient for energy storage. Thermal conductivities for solid and liquid states of some common materials often differ substantially (e.g., water being about 2.14 W/(m K) and about 0.60 W/(m K) in the solid and liquid states, respectively), and the significant difference in thermal conductivity between the solid and liquid states for paraffins also makes it a great candidate for constructing a thermal diode. This is the case even though the melt state of paraffins can present difficulties for practical construction due to low mechanical strength and leakage.

The rigid skeleton of the polystyrene foam of material B can maintain the integrity of the composite at temperatures above the paraffin's melting point. In some embodiments, the highly porous polystyrene foam can be formed from high internal phase emulsion (HIPE). The thermal conductivity of the composite below the melting point of the constituent paraffin can be almost two times higher than the thermal conductivity above the melting point. In some embodiments, other paraffins, such as eicosane and hexadecane, can be used in lieu of, or in addition to, octadecane, as the phase-change material. The approximate transition temperatures of PFH with varying porosities and paraffins are summarized in Table 1 below:

TABLE 1

Transition temperatures of PFH with varying porosities and paraffins.

| | Porosity (%) | | | | | | |
|---|---|---|---|---|---|---|---|
| | 85.37[a] | 87.05[a] | 88.02[a] | 90.03[a] | 90.71[a] | 90.71[b] | 90.71[c] |
| Melting point (° C.)[d] | 30.3 | 32.1 | 31.1 | 30.8 | 30.4 | 20.8 | 40.0 |
| Freezing point (° C.)[d] | 26.2 | 24.5 | 25.6 | 26.7 | 25.9 | 15.0 | 32.2 |
| Transition point (° C.)[e] | 28.2 | 28.3 | 28.4 | 28.8 | 28.2 | 17.9 | 36.1 |

[a]PFH-O.
[b]PFH-H.
[c]PFH-E.
[d]Determined by DSC.
[e]Average of melting point and freezing point.

It will be appreciated by one of skill in the art that changing the phase-change material can impact the resulting thermal rectifications, as described further below.

As shown in FIG. 2, the first step in manufacturing the thermal diode 200 can include coupling the PMMA film 202 to an empty foam 204 to form an empty thermal diode 206. The foam 204 can be microporous and/or nanoporous to house a paraffin-based phase-change material, or the like, therein. The foam 204 can be made, by way of non-limiting example, using a high internal phase emulsion method, followed by grinding and polishing the foam to a desired thickness. In some embodiments, polystyrene foam with high porosity can form the skeleton of the foam 204 due to the low thermal conductivity and high modulus of polystyrene. The polystyrene foams 204 can be made using high internal phase emulsion as a template. After polymerization of the external oil phase and the removal of the internal water phase, rigid, high porosity, and interconnected foams can be obtained. One skilled in the art will appreciate that varying oil/water volume ration can change the porosity of the resulting foam 204, thereby varying their respective densities. For example, as shown in Table 2 below, porosities of between about 85.4% and about 90.7% can be obtained by varying the oil/water volume ratios from about 1:5 to about 1:10, which varies the values of densities from about 0.098 g/cm$^3$ to about 0.154 g/cm$^3$. The resultant foam can include interconnected pores with pore diameters of about 2 µm, about 2.25 µm, about 2.5 µm, and so forth. In one non-limiting embodiment in which an empty foam has a porosity of about 90.7%, the pore diameters can be about 2.56 µm.

TABLE 2

Formulations and properties of high internal phase emulsion foam

| Run | Oil:Water (v/v) | Porosity (%) [a] | Density (g/cm$^3$) [a] |
|---|---|---|---|
| 1 | 1:5 | 85.4 | 0.154 |
| 2 | 1:6 | 87.0 | 0.136 |
| 3 | 1:7 | 88.0 | 0.126 |
| 4 | 1:9 | 90.0 | 0.105 |
| 5 | 1:10 | 90.7 | 0.098 |

[a] Density was obtained by measuring volume and weight at room temperature, and porosity was calculated by assuming skeleton's density was same as polystyrene's density, 1.05 g/cm$^3$.

The PMMA film 202 can be coupled to the foam 204 by one or more of pasting, gluing, reacting, or any other method known to one skilled in the art to attach a film to foam. In some embodiments the PMMA 202 can interface with the foam 204 by Devcon epoxy. To make the PFH, empty foams with different porosities can be submerged in liquid octadecane, as shown. The octadecane can fuse to the PMMA film 202 to form a foam-PMMA-phase-change material composite (PFH-O) composite 208. In the illustrated embodiment, the resulting composite 208 provides for circular disks that are superimposed on one another, though, it will be appreciated by those skilled in the art that the composite 208 can be of any shape, e.g., rectangular, square, triangular, and so forth, as PMMA and polystyrene tend to be straightforward to process. In some embodiments, the composite 208 can be vacuum-impregnated at varying temperatures for varying times (e.g., about 2 hours at about 40° C.) to further impregnate the phase-change material to the empty thermal diode 206. Polystyrene is a relatively hydrophobic material that has a strong affinity to nonpolar organic solvents, which can allow it to encapsulate the organic paraffin very well. This allows the PFH to maintain its solid-state even at temperatures above the paraffin's melting point. In some embodiments, copper foil 210 can be epoxied to one or more of the upper and lower surfaces of the thermal diode, which can reduce interfacial thermal resistance and efficiently spread the heat along contact surfaces of the thermal diode.

It will be appreciated that the solid-state thermal diode 200 can be fabricated from the junction of the (PMMA) (material A) and an PFH-O (material B). Analysis of Young's Modulus for each material can determine whether the material can be preferential for use in constructing the solid-state thermal diode 200. For example, larger values of Young's Modulus at a phase-change material's melting transition point, $k_{B2}$ and $k_{B1}$, can determine its usability for forming solid-state thermal diodes 200 capable of efficiently harvesting energy. In the case of PFH-O composite, moduli above the melting transition point having values of about 11.5 MPa or greater suggest that the PFH-O composite can be used for constructing the solid-state thermal diode 200.

The structure of the thermal diode 200 can be optimized in a variety of ways. For example, compounds and/or composites that have larger changes in thermal conductivity measured below and above the transition point can yield more optimal thermal diodes. In the case of the PFH-O composite, a porosity of about 90.7% was chosen for thermal diode fabrication as the thermal conductivities above the transition point can vary insignificantly from about 0.170 W/(m K)$^{-1}$ to about 0.167 W/(m K)$^{-1}$ as the porosity is increased. For temperatures below the transition point, on the other hand, the thermal conductivity of the PFH-O composite can increase from about 0.259 W/(m K)$^{-1}$ to about 0.350 W/(m K)$^{-1}$. Further, in the case of PFH-O, the empty foam can include a low thermal conductivity that decreases as porosity is increased. The low thermal conductivity of the foam 202 can allow the phase-change material, e.g., octadecane, to dominate the effective thermal conductivity of the PFH-O composite.

In some embodiments, the efficiency of the thermal diode 200 can be optimized by constructing an ideal thickness ratio of phase-change material to phase invariant material, e.g., PFH-O to PMMA. For example, the ideal thickness ratio of PFH-O to PMMA can be about 2.0 mm to about 1.6 mm to produce a thermal diode 200 with an overall thickness of about 3.6 mm, though it will be appreciated that the ideal thickness ratio can vary based on porosity of the foam used, the temperature at which the phase invariant material is submerged in the phase-change material, and so forth. The approximate thermal conductivity of PFH composites using other paraffins, such as eicosane (PFH-E) and hexadecane (PFH-H), and their effect on the calculated thickness ratios of PMMA and PFH, are summarized in Table 3 below:

TABLE 3

Thermal conductivity of PFH and the calculated thickness ratio of PMMA and PFH.

| | Thermal conductivity (W/(m K)) | | |
|---|---|---|---|
| Types | Below T* [a] | Above T* [a] | $L_B/L_A$ [b] |
| PFH-O | 0.350 | 0.167 | 1.26 |
| PFH-H | 0.327 | 0.170 | 1.23 |
| PFH-E | 0.270 | 0.160 | 1.08 |

[a] Transition point, about 28.2° C. for PFH-O, about 17.9° C. for PFH-H and about 36.1° C. for PFH-E as obtained by DSC.
[b] According to the analytical model from Cottrill and Strano, $L_B$ is thickness of PFH, $L_A$ is thickness of PMMA.

$$\frac{L_B}{L_A} = \frac{\sqrt{k_{B1}k_{B2}}}{k_A}, \text{ where we set } L_A = 1.6 \text{ mm.}$$

Measurement Systems for Measuring Thermal Rectification of Thermal Diodes

Figure 3A:
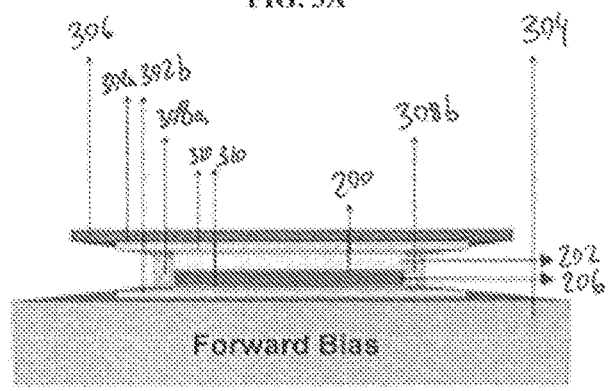
FIG. 3A is a schematic perspective, cross-sectional view of one exemplary embodiment of a set-up for measuring thermal rectification of the thermal diode of FIG. 2 under forward bias.
Figure 3B:
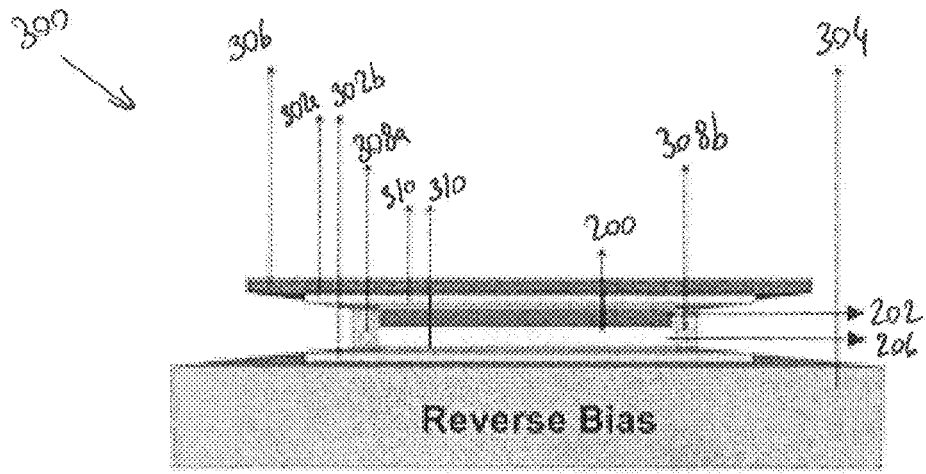
FIG. 3B is a schematic perspective, cross-sectional view of one exemplary embodiment of a set-up for measuring thermal rectification of the thermal diode of FIG. 2 under reverse bias.

FIGS. 3A and 3B illustrate a measurement system 300 for measuring the thermal rectification of the thermal diode under steady state. The maximum thermal rectification ratio ($Q_{max}$) for a phase-change thermal diode with a given set of thermal conductivities above and below the material's transition point, $k_{B2}$ and $k_{B1}$, respectively, is shown in Equation (2):

$$Q_{max} = \sqrt{\frac{k_{B1}}{k_{B2}}} \tag{2}$$

The thermal conductivity ($k_{Bi}$) of the phase-change material, e.g., PFH, above (i=2) and below (i=1) the paraffin's transition point for a given porosity $\Phi$, skeleton thermal conductivity $k_s$, and paraffin thermal conductivity $k_{pi}$, is given by Equation (3):

$$k_{Bi} = k_s \left[ \frac{k_{pi} + 2k_s + 2\Phi(k_{pi} + k_s)}{k_{pi} + 2k_s - \Phi(k_{pi} + k_s)} \right] \quad (3)$$

where the thermal conductivities of the paraffin (octadecane) at liquid state (i=2) and solid state (i=1) are assumed to be 0.17 W/(m K) and 0.4 W/(m K), respectively. One skilled in the art will appreciate that a larger maximum thermal rectification ratio, $Q_{max}$, for PFH can be obtained with larger porosity, $\Phi$, and smaller skeleton thermal conductivity, $k_s$.

As shown in FIGS. 3A and 3B, the steady state measurement system 300 can include a pair of thermocouples 302a, 302b, a thermal sink or thermoelectric bath 304, a heater 306, and a pair of thermal insulators 308a, 308b. The various components of the steady state measurement system can be set up in a variety of ways to measure thermal rectification and/or other behaviors of the thermal diode under two diffusion time scales or temperature biases: reverse and forward.

The steady state measurement system 300 can allow for measurement of the steady state heat flux and temperature through the thermal diode 200 at a given temperature bias. The measurements can be made by thermocouples 302a, 302b that are placed in contact with the thermal diode 200. As shown, the thermal diode 200 can be disposed between an upper thermocouple 302a and a lower thermocouple 302b. One or more of the thermocouples 302a, 302b can include a heat flux sensor (not shown) therein. For example, the upper thermocouple 302a can include a heat flux sensor such that the upper thermocouple 302a can measure heat flux in addition to temperature, while the lower thermocouple 302b measures temperature, though, in some embodiments, the lower thermocouple 302b or both thermocouples 302a, 302b can measure heat flux. In some embodiments, the thermocouples 302a, 302b in the steady state measurement system 300 can be K-type thermocouples (e.g., omega Engineering HFS-3) encased in a kapton film.

The thermoelectric bath 304 can be placed below the thermal diode 200. As shown, the steady state measurement system 300 can be placed in contact with a surface of the thermoelectric bath 304. The thermal bath 304 can be a temperature-controlled thermoelectric bath to regulate a temperature to which the thermal diode 200 is exposed. In some embodiments, a thermal paste can be used between the lower thermocouple 302b and the thermoelectric bath 304, or between the thermal diode 200 and the upper thermocouple 302a having the heat flux sensor thereon. Alternatively, or additionally, the thermal diode 200 can be surrounded by thermally insulating materials in order to minimize heat leakage to the environment. Some non-limiting examples of thermally insulating materials can include foam insulation, such as expanded polystyrene, neoprene foam, extruded polystyrene, and other materials known to those skilled in the art.

The thermoelectric heater 306 can be placed in contact with the heat flux sensor of the upper thermocouple 302a. Thermal paste can be used to couple the heater 306 to the heat flux sensor. In some embodiments, a copper paper 310 can be disposed between the upper thermocouple 302a and the heater 306. The thermoelectric heater 306 can use a direct current (DC) voltage source to measure heat flux through the thermal diode 200 with different temperature biases, or diffusion times scales. Measurements can be made by maintaining the thermoelectric heater 306 at a constant temperature above the transition point of the constituent paraffin material in the thermal diode 200 by adjusting the DC voltage input, while the temperature of the lower thermoelectric bath 304 is varied. For example, varying the temperature of the thermoelectric bath 304 while maintaining the temperature of the thermoelectric heater 306 at about 50° C. can be used to measure the heat flux in forward and reverse directions. The reverse temperature bias refers to the steady state measurement system 300', as illustrated in FIG. 3B, which shows the steady state measurement system 300' taking temperature and heat flux measurements of the thermal diode 200 in a reverse bias. As shown, these measurements can be made by flipping the thermal diode 200 such that the PMMA 202 is proximal to the lower thermocouple 302b'.

The reverse temperature bias refers to the hybrid foam PFH-O composite 208 on the upper (hot) side of the diode 200, which indicates that it is mostly above its transition point and will have a lower thermal conductivity. The heat flux as a function of temperature difference is nearly a straight line until $\Delta T$ is about 37° C. As the temperature difference exceeds this value, the bottom (cold) side of the diode 200 becomes cold enough to cause the PFH-O composite 208 to exist below the phase-change transition, which results in an increased effective thermal conductivity of the composite. In the forward direction, the PFH-O composite 208 can be exposed to the lower thermoelectric bath 304 (cold side). As the temperature bias is increased, the lower thermoelectric bath 304 becomes cooler and a portion of the composite 208 can exist below the phase-change transition, which can result in a higher effective thermal conductivity.

One skilled in the art will appreciate that there will exist an optimum magnitude of the temperature bias such that under the reverse temperature bias the hybrid foam 208 can exist mostly in the melt phase, and under the forward temperature bias the hybrid foam 208 can exist mostly in the lower temperature phase. The optimum magnitude can result in the largest discrepancy in the thermal conductivity with respect to the direction of the temperature bias. For example, in the case of the PFH-O composite 208, a maximum rectification, $Q_{max}$, of about 1.38 can be obtained. In some embodiments, as discussed above, changing the phase-change material to another type of paraffin having a different transition temperature can impact the resulting thermal rectification. For example, and as discussed above, using hexadecane or eicosane in lieu of octadecane under the same methods as those discussed for octadecane can result in maximum rectification values of about 1.24 and about 1.18, respectively.

The thermal diodes 200 that include the PFH-O composite 208 can also generate power output under unsteady state conditions. One skilled in the art will appreciate that temperature difference between two reservoirs has the capacity for useful work when connected by a heat engine or thermoelectric. For example, as discussed above, the thermal resonator 100 is one embodiment of a device that can be used to generate a meaningful power output for harvesting energy. Further, to the extent an embodiment herein provides for a heat engine, unless otherwise indicated, a thermoelectric can be used in place of a heat engine.

Thermal Resonance Devices with Terminal Masses

Figure 4A:
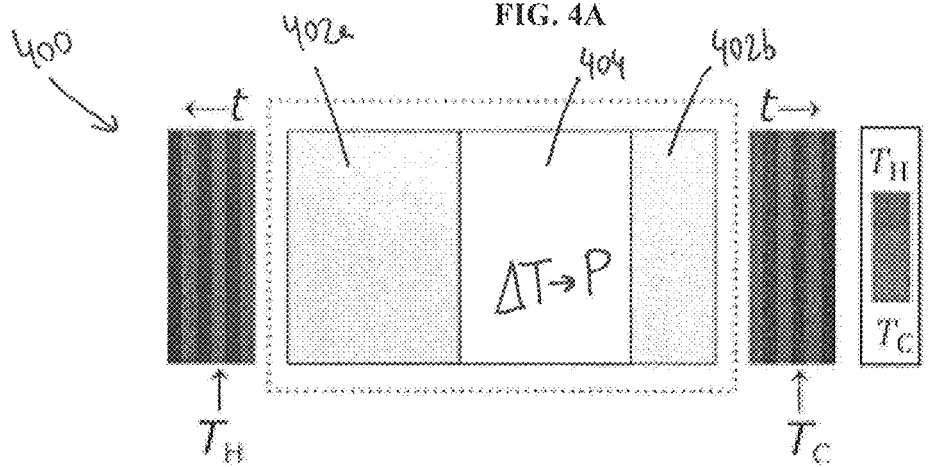
FIG. 4A is a schematic side view of another exemplary embodiment of a thermal resonance device.

FIG. 4 illustrates a general schematic of a thermal resonator 400 that can be used to generate electrical energy from thermal fluctuations with an accompanying ambient temperature profile. The thermal resonator 400 can include a plurality of thermal masses 402a, 402b and a heat engine 404, which can convert temperature fluctuations to a spatial temperature difference for power extraction via the heat engine. As shown, the heat engine 404 can be encased or otherwise disposed between the first thermal mass 402a and the second thermal mass 402b such that the heat engine 404 is in communication with each mass. In some embodiments the heat engine 404 can contact each of the first and second thermal masses 402a, 402b such that temperature fluctuations across each of the masses can be sent to the heat engine 404 for conversion to power. As indicated elsewhere herein, to the extent a heat engine is used as part of a thermal resonator, a person skilled in the art, in view of the present disclosures and those provided in the patent application entitled "Material, Devices, and Methods for Resonant Ambient Thermal Energy Harvesting," of Strano et al. that is incorporated by reference above, a thermoelectric can also be used in lieu of a heat engine.

In the illustrated embodiment, the first mass 402a is larger in one or more of volume or surface area, or possesses a larger diffusion time scale than the second mass 402b. In such a configuration, the first mass 402a can be referred to as a dominant thermal mass. The dominant thermal mass can be larger than the second mass in one or more of length, width, depth, or any dimension recognized by a person of skill in the art, or possesses the larger diffusion time scale. In some embodiments, the second mass 402b can be larger than the first mass, which can result in the second mass being the dominant thermal mass. One skilled in the art will appreciate that masses having larger diffusion time scales are typically geometrically larger, though, in some embodiments, geometrically smaller masses can have larger diffusion time scales based on composition, density, and so forth. Moreover, if both masses 202a, 202b have equal diffusion time scales, the resonator can generate little or no power. Each mass, when exposed to a temperature that can oscillate in time between hot (red; $T_H = T_0 + T_A$) and cold (blue; $T_C = T_0 - T_A$), as shown, can convert or transform the temperature fluctuations into a spatial temperature difference, $\Delta T(t)$, across the thermal resonator. The spatial temperature difference can then be converted to usable work, e.g., power (P), by the generic heat engine, as described further below.

Figure 4B:
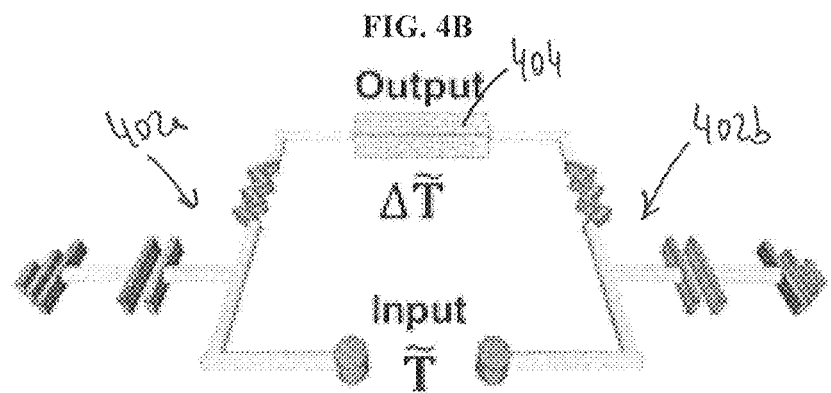
FIG. 4B is a pictorial representation of a thermal circuit demonstrating the operation and modeling details of the thermal resonance device of FIG. 4A.

FIG. 4B illustrates a standard, linear thermal circuit that can demonstrate the operation and modeling details of the thermal resonator 400. As shown, the first and second thermal masses 402a, 402b, which encase or are otherwise disposed on either side of an output, e.g., heat engine 404, can be connected by an input 406. Temperature fluctuations supplied by the time varying source can be transformed into a spatial temperature difference in a variety of ways. As discussed above, ambient energy can act as an input into a system for storage and conversion to electrical energy. The first and second thermal masses 402a, 402b can be expressed in terms of their thermal resistance parameters ($k_1$, $k_2$, $L_1$, $L_2$) and thermal capacitor parameters ($\rho_1 C_{p,1}, \rho_2 C_{p,2}$). The first and second masses 402a, 402b can translate an oscillatory temperature input into a bipolar, oscillatory temperature difference output ($\Delta \tilde{T}$). An exemplary oscillating temperature can include an oscillating temperature waveform, a form of ambient energy, can be input to the thermal diode bridge circuit to be converted to electrical energy. The oscillating temperature waveform can be modeled as:

$$\tilde{T}_{in}(t) = T_0 + T_A \sin(\omega t), \tag{4}$$

where $\tilde{T}_{in}$ is the ambient temperature, $T_0$ is the median ambient temperature, $T_A$ is the amplitude for ambient thermal fluctuations, $\omega$ is the fundamental angular frequency of temperature oscillations, and t is time.

The first and second thermal masses can be linear such that performance (Q) of the thermal diode is equal to 1, as described above. One skilled in the art will appreciate that although two masses are shown, zero, one, or three or more masses can be included in the standard, linear thermal circuit. In some embodiments, the first and second thermal masses can be subjected to the input boundary conditions of Equation (4) and no heat flux conditions, as defined in Equation (5), as its output.

$$\frac{\partial T}{\partial x} = 0 \tag{5}$$

The conservation of thermal energy for each of the first and second thermal masses 402a, 402b is governed by Equation (6):

$$\frac{\partial T_j}{\partial t} = \alpha_j \frac{\partial^2 T_j}{\partial x_j^2} (j = 1 \text{ or } 2) \tag{6}$$

where $T_j$ is the spatial and temporal temperature of linear mass j, $x_j$ is the spatial dimension for linear mass j, and $\alpha_j$ is the thermal diffusivity of linear mass j, and the temperature profile of each thermal mass in time is given by Equation (7):

$$T_j(x_j, t) = T_0 + T_a \text{Re}[e^{i\omega t}] \frac{\text{Re}\left[\cosh\left(\sqrt{\frac{i\omega}{\alpha_j}} (L_j - x_j)\right)\right]}{\text{Re}\left[\cosh\left(\sqrt{\frac{i\omega}{\alpha_j}} L_j\right)\right]} \tag{7}$$

where $L_j$ is the length of linear thermal mass j.

Calculating the temperature profile for each thermal mass at its output and subtracting the temperatures can yield the output of the linear thermal circuit of FIG. 4B, and can be described by Equation (8):

$$\Delta T_{out} = T_a \text{Re}[e^{j\omega t}] \left( \frac{1}{\text{Re}\left[\cosh\left(\sqrt{\frac{i\omega}{\alpha_1}} L_1\right)\right]} - \frac{1}{\text{Re}\left[\cosh\left(\sqrt{\frac{i\omega}{\alpha_2}} L_2\right)\right]} \right) \tag{8}$$

where $\Delta T_{out}$ is the temperature difference output between the two linear thermal masses 402a, 402b. As shown by these models, the standard, linear thermal circuit can include bipolar, oscillatory temperature inputs and bipolar, oscillatory temperature difference outputs.

Thermal Resonance Devices with Thermal Diodes

One skilled in the art will recognize that the thermal diodes 200 described above can be used to fabricate a thermal diode bridge circuit that functions as a thermal resonator circuit. For example, thermal diodes composed of an octadecane-based PFH, e.g., PFH-O composite 208, fused with a polycarbonate (PC) material can be used with a thermal resonator, e.g., thermal resonator 400, to fabricate a thermal diode bridge. An exemplary embodiment of the thermal diode bridge is shown below in FIGS. 5A and 5B. The thermal diode bridge can be a dynamic thermal circuit that converts an oscillatory temperature input into a single polarity temperature difference with implications for transient thermal energy harvesting, e.g., a thermal resonator circuit. One skilled in the art will appreciate that the thermal diode bridge circuit is a thermal analog to the electrical diode bridge circuit, which can have widespread applications in transient thermal energy harvesting and conservation, and thermal information processing.

Figure 5A:
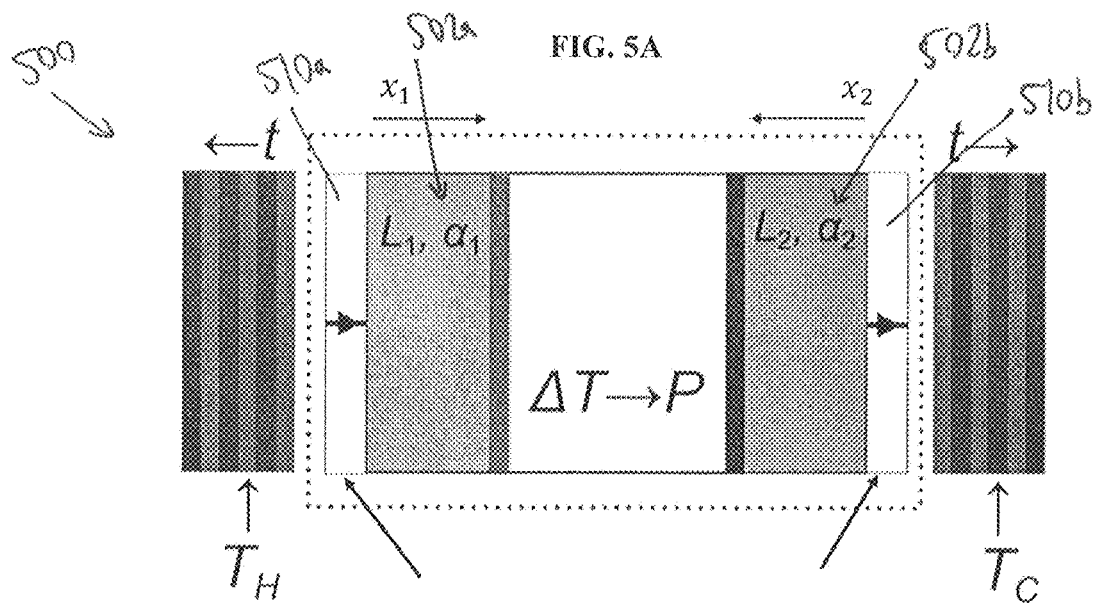
FIG. 5A is a schematic side view of still another exemplary embodiment of a thermal resonance device, the device having two thermal diodes incorporated therein.

FIG. 5A illustrates a general schematic of a thermal resonator 500 having a heat engine encased between two linear thermal masses 502a, 502b (j=1 and 2; length, $L_j$; thermal diffusivity, $\alpha_j$), which are surrounded by two thermal diodes 510a, 510b as highly non-linear thermal conducting elements capable of yielding a single polarity electrical output. As shown, a pair of thermal diodes 510a, 510b can be disposed on opposite ends of the first and second thermal masses 502a, 502b. By employing thermal diodes 510a, 510b on its external boundaries with the environment, the thermal resonator 500 can expose a larger surface of the diodes to ambient temperature fluctuations. The thermal masses 502a, 502b can vary in size (e.g., length, width, depth, volume, surface area, etc.), or possess different diffusion time scales, as shown and discussed above with respect to the resonator 400, though, in some embodiments, the thermal masses 502a, 502b can have equal lengths.

The thermal diodes 510a, 510b can have a preferential direction for the heat transfer such that a persistent, single polarity spatial temperature difference can develop across the central heat engine 504 (or thermoelectric, as discussed above). As shown, the preferential direction for heat transfer can be indicated by arrows on the diodes 510a, 510b, though the direction can also be indicated by other symbols recognized by one skilled in the art. In the illustrated embodiment, the preferential direction is seen pointing left to right, from the first mass 502a to the heat engine 504 and out of the second mass 502b. In other embodiments, the preferential direction can be reversed. The resulting voltage difference can then be converted to usable work, e.g., power (P), by the generic heat engine, as described further below. The thermoelectric device 500 can yield electrical power according to Equation (9):

$$P = \frac{(\Gamma_S \Delta T(t))^2}{R_{eff}} \quad (9)$$

where $\Gamma_s$ is the Seebeck coefficient, and $R_{eff}$ is an effective resistance that accounts for thermal and electrical resistances in the system.

Figure 5B:
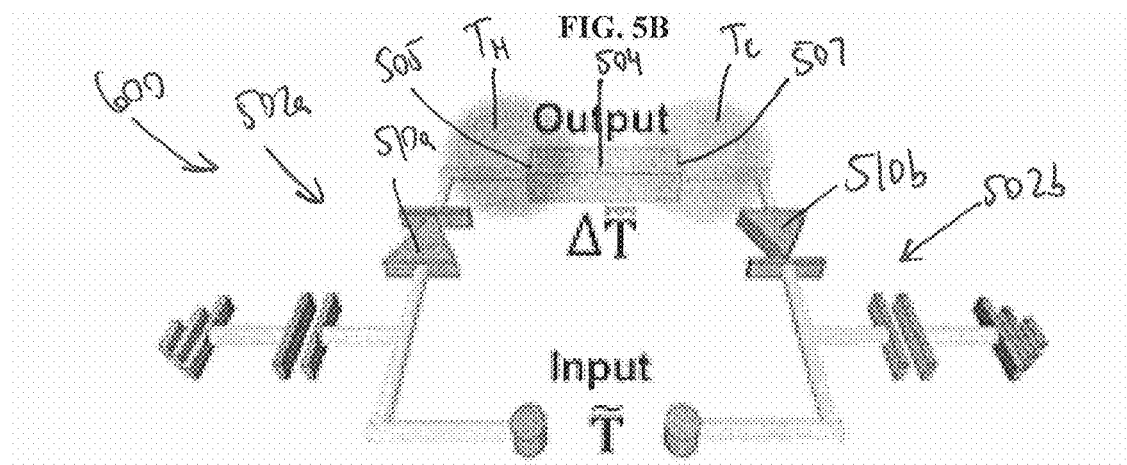
FIG. 5B is a pictorial representation of a thermal circuit demonstrating the operation and modeling details of the thermal resonator of FIG. 5A.

FIG. 5B illustrates a nonlinear, thermal diode bridge circuit that can demonstrate the operation and modeling details of the thermal resonator 500. As shown, the thermal diode bridge circuit can include two non-linear thermal diodes 510a, 510b that are capable of translating an oscillatory temperature input to a single polarity temperature difference output. One skilled in the art will appreciate that although two masses are shown, zero, one, or three or more masses can be included in the nonlinear, thermal diode bridge circuit.

Each thermal diode 510a, 510b can include a junction between a phase-change material (B) and a phase invariant material (A), as previously described. The conservation of thermal energy for material A is governed by the linear differential equation shown in Equation (10):

$$\frac{\partial T_A}{\partial t} = \alpha_A \frac{\partial^2 T_A}{\partial x_A^2} \quad (10)$$

where $T_A$ is the spatial and temporal temperature of material A, $x_A$ is the spatial dimension for material A, and $\alpha_A$ is the thermal diffusivity of material A.

The conservation of thermal energy for the phase-change material B is governed by a nonlinear differential equation, as shown in Equation (11):

$$\rho_B C_{B,eff} \frac{\partial T_B}{\partial t} = \frac{\partial}{\partial x_B}\left(k_B(T_B)\frac{\partial T_B}{\partial x_B}\right) \quad (11)$$

where $\rho_B$ is the density of material B, $T_B$ is the spatial and temporal temperature of material B, $x_B$ is the spatial dimension for material B, and $k_B$ is the thermal conductivity of material B. $C_{B,eff}$ is given by Equation (12):

$$C_{B,eff} = C_{B,0}\left(1 + \frac{sT_a}{T_m}\right) \quad (12)$$

where s is the Stefan number. The Stefan number is given by Equation 13:

$$s = \frac{\varphi h}{2C_{B,0}T_a} \quad (13)$$

where $\varphi$ is the mass fraction of the phase-change material, h is the latent heat per mass, $C_{B,0}$ is the standard heat capacity of material B, and $T_m$ is the half-width of the melting range for material B. It will be appreciated that a phase-change material operating within proximity to its phase change will have an effective heat capacity associated with the phase change.

Further, Equation (14) provides the smooth function that is assumed for the temperature dependent thermal conductivity of material B:

$$k_B = k_{B,0}\left(1 + \frac{2\beta}{\pi}\tan^{-1}(\gamma(T_B - T^*))\right) \quad (14)$$

where $k_{B,0}$ is the mean thermal conductivity of the two phases for material B, T* is the transition temperature of material B, $\gamma$ is an amplification factor that should be sufficiently large in order to represent the smooth step change in thermal conductivity, and $T_B$ is the temperature is the temperature at the interface of the second mass and the second thermal diode. β is determined by the thermal conductivity of each phase. This step-like change in thermal conductivity due to the phase change of material B is, at least in part, responsible for thermal rectification.

Depending on the direction of the temperature gradient across the thermal diode (forward or reverse temperature bias), elevated or reduced thermal conductivities can be attained relative to the median thermal conductivity ($k_{B,0}$). It should be noted that these equations have an experimental basis and are proposed relations for the thermal conductivities of the thermal diodes, which can stand in contrast to the equations that represent the conductivity of electrical diodes. In contrast to electrical diodes, for which current-voltage curves have an exponential dependence, heat flux vs. temperature bias curves for thermal diodes are most typically characterized by two approximately linear operating regimes with differing effective thermal resistances. For this reason, a smooth step function (inverse tangent) can be used to model the change in thermal conductivity with respect to bias. The magnitude of the temperature bias, as well as the mean temperature of the bias, for achieving a step in the thermal rectifier's thermal conductivity can differ depending on the physical mechanism for the thermal diode's operation. The onset of the approximately linear operating regime can be adjusted by varying the steepness of the thermal conductivity modulation ($\gamma$) in Equation (14). On the other hand, the mean temperature for thermal diode operation is the mean temperature of oscillations ($T_0$) in Equation (14).

As shown by these models, the thermal diode bridge circuit can transform the input bipolar temperature oscillations into a single polarity temperature difference. The temperature difference across the output 504 can range from hot ($T_H$) at a first end 505 of the output to cold ($T_C$) at a second end 507 of the output, though it will be appreciated that the temperature at the first and second ends 505, 507 can be reversed in the event that the diodes 510a, 510b point in the opposite direction. One skilled in the art will recognize that in these models, identical thermal diodes and linear thermal masses on either side of the heat engine are assumed unless otherwise noted.

One skilled in the art will also recognize that steady state heat transfer across the thermal diodes is assumed to be achieved at all times for the purposes of the experimental models provided herein, e.g., the thermal diffusion time scale for the thermal diode is significantly faster than that of the linear thermal masses, yielding the following boundary conditions at the interface between the linear thermal masses and thermal diodes, shown in Equation (15):

$$J_{j,in} = -k_j \frac{\partial T_j}{\partial x_j}\bigg|_{x_j=0} = \frac{k_{dj}}{L_{dj}}(\tilde{T}_{amb}(t) - T_{j,xj=0}) \quad (15)$$

where $J_{j,in}$ is the heat flux through thermal diode j and entering linear thermal mass j, $k_j$ is the thermal conductivity of linear thermal mass j, $L_{dj}$ is the length of thermal diode j, and $x_j=0$ refers to the interface of linear thermal mass j with thermal diode j.

For the internal boundary conditions, no heat flux boundary conditions are imposed at the boundaries of the first and second thermal masses 502a, 502b with the heat engine 504, corresponding to an open circuit upper limit, as shown in Equation (16):

$$k_j \frac{\partial T_j}{\partial x_j}\bigg|_{x_j=L_j} = 0 \quad (16)$$

The variables $\tau$ (dimensionless time), $\nu$ (frequency of temperature oscillations), R (ratio of thermal diffusion time scales for the second linear thermal mass to the first thermal mass), $n_j$ (dimensionless spatial variable for linear thermal mass j), and $\Theta_j$ (dimensionless temperature of linear thermal mass j) are non-dimensionalized according to the various equations associated with Equation (17):

$$\tau = t\frac{\alpha_1}{L_1^2}, \nu = \omega\frac{L_1^2}{\alpha_1}, R = \left(\frac{L_2^2}{\alpha_2}\right)\left(\frac{\alpha_1}{L_1^2}\right), n_j = \frac{x_j}{L_j}, \theta_j = \frac{T_j - T_0}{T_A} \quad (17)$$

One skilled in the art will be able to solve the equations provided herein, including those above, as well as below, via method of lines in MATLAB, or other similar programs that achieve the same relevant functionality as MATLAB, to obtain spatial and temporal temperature profiles existing throughout the thermal resonance device.

Figure 5C:
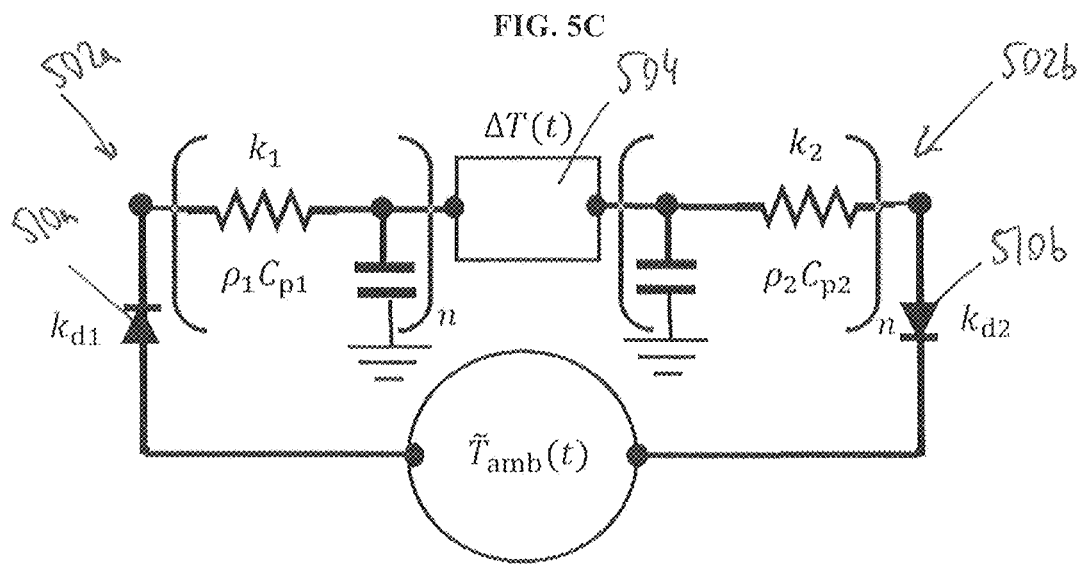
FIG. 5C is another pictorial representation of a thermal circuit demonstrating the operation and modeling details of the thermal resonance device of FIG. 5A.

An alternate representation of the thermal circuit illustration of the schematic shown in FIG. 5A is shown in FIG. 5C. The circuit in FIG. 5C illustrates that input ambient temperature fluctuations ($\tilde{T}_{amb}(t)$) are converted to a spatial temperature difference for power extraction by an arrangement of two linear thermal masses (thermal conductivity, $k_j$; volumetric heat capacity, $\rho_j Cp_j$) and two thermal diodes (thermal conductivity, $kd_j$) surrounding a heat engine.

Performance of Thermal Resonators Having Thermal Diodes

Figure 6:
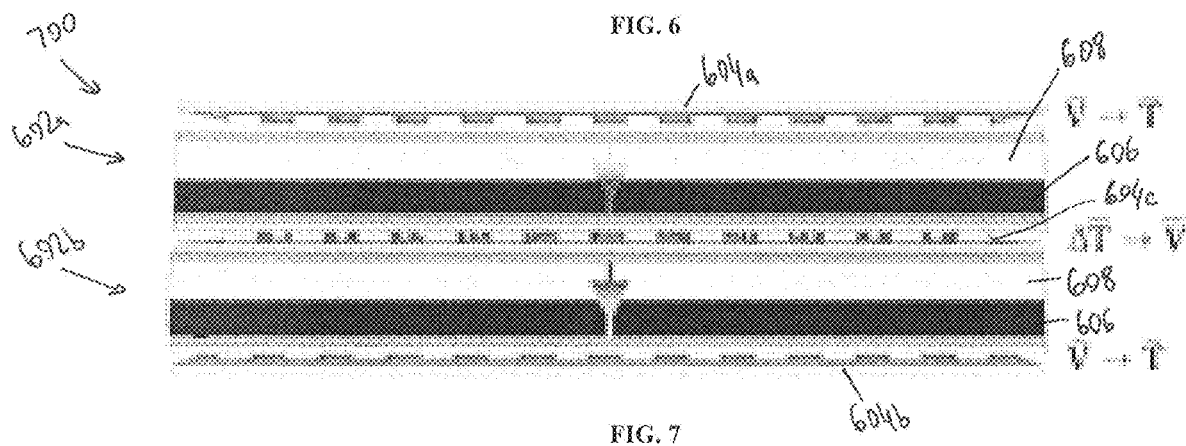
FIG. 6 is a schematic side view of a set-up for measuring a thermal diode bridge circuit.

FIG. 6 illustrates an exemplary embodiment of a thermal bridge diode set-up 700 for measuring the power output of a thermal diode bridge circuit. The set-up 700 can include a pair of thermal diodes 602a, 602b disposed between two thermoelectrics 604a, 604b that are connected to a potentiostat 606 (e.g., Princeton Applied Research; Potentiostat/Galvanostat Model 273A) to supply an oscillating temperature input. Each thermal diode 602a, 602b can include the PFH-O composite of varying thickness (e.g., about 460 μm) as the phase-change material 606 and polycarbonate (PC) of varying thickness (e.g., about 380 μm) as the phase invariant material 608. As shown, the thermoelectrics 604a, 604b can be positioned on opposite sides of the thermal bridge diode set-up 700 such that each thermoelectric 604a, 604b contacts a surface of the first and second thermal diodes 602a, 602b. The thermoelectrics 604a, 604b can supply identical, oscillating temperature boundary conditions to either side of the thermal diode bridge circuit to generate a potential difference therebetween. The thermoelectrics 604a, 604b can be connected in parallel, as shown, although in other embodiments the thermoelectrics can be connected in series. Thermoelectrics wired in parallel can supply an oscillatory voltage profile that can be used to generate an oscillatory temperature input to the thermal diode bridge. The thermoelectrics 604a, 604b can be made from bismuth telluride ($Bi_2Te_3$) or another material known in the art to provide power generation. As shown, three 4.0 cm ×4.0 cm commercial $Bi_2Te_3$ thermoelectrics (TECTEG; 03111-5L31-03CF) can be wired as the thermoelectrics, though a person skilled in the art, in view of the present disclosures, will understand the size, number, characteristics, and configuration of modules can vary. In some embodiments, the thermal diode bridge set-up 700 can include a thermal paste, or other equivalent material known to those skilled in the art, disposed between the thermoelectrics and the stacked thermal diodes 602a, 602b to minimize interfacial thermal resistance therebetween.

The oscillating temperature input supplied by the thermoelectrics 604a, 604b can be translated by the first and second thermal diodes 602a, 602b to a single polarity temperature difference output. A person skilled in the art will recognize that the preferential direction for heat transport of the thermal diodes, e.g., from hot to cold, as indicated by the arrows of the two diodes 602a, 602b that face in the same direction, can result in a single polarity temperature difference output across the thermal diode bridge circuit 600. The output can be measured by an internal thermoelectric 604c positioned between the thermal diodes 6020a, 602b, as shown. The internal thermoelectric 604c can output an open circuit voltage related to the temperature difference existing across it according to Equation (18):

$$V = \Gamma_S \Delta T \tag{18}$$

where V is voltage and $\Gamma_S$ is the Seebeck coefficient. In some embodiments, an output temperature difference, as measured by the central thermoelectric 604c, can be calculated with Equation (18) by assuming a value for the Seebeck coefficient (e.g., 1.5 mV K$^{-1}$) in closed circuit and open circuit conditions. In some embodiments, the internal thermoelectric 604c can be wired to a multimeter (e.g., Fluke 115 True RMS Multimeter) for open circuit voltage measurement or connect with an external resistor (e.g., a 15 ohm external resistor) to form a closed circuit for the closed circuit measurement.

One skilled in the art will appreciate that the output temperature difference of the thermal diode bridge 600 is strongly single polarity in the closed circuit condition and slightly single polarity in the open circuit condition. Taking Fast Fourier Transforms (FFTs) of the thermal diode bridge outputs, which represent dynamic thermal rectification, can be characterized by harmonic behavior with the fundamental frequency equaling the input driving frequency for the circuit (about 0.0785 s$^{-1}$). A non-rectifying, linear thermal circuit, as shown in FIG. 4B, can yield an FFT with a single characteristic frequency, which is the input frequency of temperature oscillations. One skilled in the art, in view of the present disclosures, will recognize that analysis of the FFTs of the thermal diode bridge circuit 600 suggest that advanced thermal circuits with a diode can be analogous to complex electrical circuits that can be constructed currently with low costs and relative ease. Further, analysis of the FFTs in accordance with the present disclosures suggests that the thermal diode bridge circuit 600 can dynamically rectify temperature oscillations that can be particularly advantageous in the fields of transient thermal energy harvesting and conservation. For example, in some embodiments, the input to such a high performance thermal circuit can include ubiquitous temperature fluctuations, e.g., related to the diurnal cycle or a duty cycle, and the single polarity output can be employed for energy harvesting via a heat engine or for thermal management.

An analysis of the effect of temperature oscillation amplitude and phase transition temperature on the output of the thermal diode bridge 600 suggests that temperature oscillations centered at the phase transition temperature may not result in dynamic thermal rectification. However, if the temperature oscillations are not centered at the phase transition temperature, a very slight degree of dynamic thermal rectification can occur.

As discussed above, the performance of thermal diodes can be quantified by the thermal rectification ratio, which is equal to the ratio of the forward ($q_f$) and reverse ($q_r$) heat flux magnitudes at steady state for thermal diodes operating under forward and reverse temperature biases of the same magnitude, respectively. The thermal rectification ratio is calculated at steady state, and one skilled in the art will appreciate that it is, to a varying degree, a function of both the magnitude of the temperature bias as well as the temperature range of the bias.

While FIGS. 5A and 5B illustrated schematic illustrations of thermal resonators that include thermal diodes, and thermal circuitry related to the same, and FIG. 6 is a schematic illustration of an experimental set-up of a thermal diode bridge, a person skilled in the art, in view of the present disclosures, will understand how these configurations can be implemented for actual use in conjunction with a thermal resonator in an environment that includes thermal fluctuations. By way of non-limiting example, the set-up illustrated in FIG. 1 can be modified such that the thermal masses 102a, 102b are replaced by thermal diodes that operate in a manner as provided for herein. A person skilled in the art, in view of the present disclosures, will understand many other possible set-ups in which thermal diodes are placed on opposed sides of an energy conversion component, such as a heat engine or thermoelectric.

Figure 7:
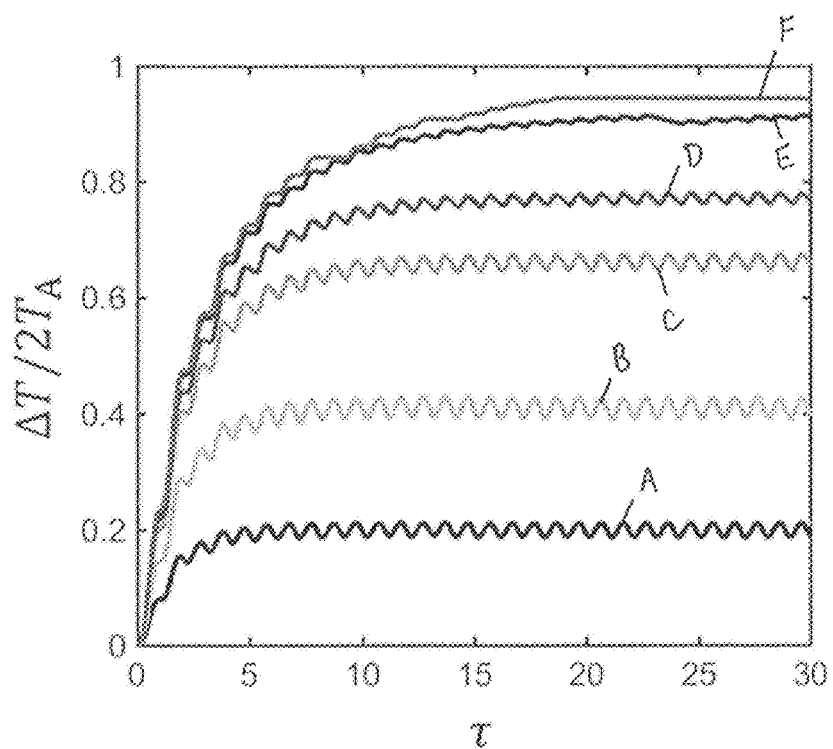
FIG. 7 is a graph illustrating a temperature difference output of a thermal resonance device incorporating thermal diodes at various levels of thermal rectification ($\beta$) during open circuit operation.

FIG. 7 illustrates a sample temperature difference output of a thermal resonator that incorporates thermal diodes, e.g., resonator 500, as a function of dimensionless time ($\tau$) while the level of thermal rectification ($\beta$) is varied during open circuit operation between levels in which $\beta=0$ represents no thermal rectification and $\beta=1$ represents ideal thermal rectification. The labeled levels of thermal rectification ($\beta$) include 0.4 (A), 0.7 (B), 0.9 (C), 0.95 (D), 0.99 (E), and 1 (F). It will be appreciated that the temperature difference in the graph is shown being normalized by the maximum attainable temperature difference. As shown, the temperature difference that exists across the heat engine can approach the maximum attainable temperature difference given the amplitude of temperature fluctuations ($2T_A$).

In embodiments in which linear thermal masses and thermal diodes on either side of the heat engine are identical, at least four parameters of the thermal resonator exist for manipulation, as shown by the various equations associated with Equation (19):

$$\beta, \nu = \omega \frac{L_1^2}{\alpha_1}, \gamma' = \gamma T_A, Bi_{d,0} = \frac{k_{d,0} L_1}{k_1 L_d}, \tag{19}$$

where $\beta$ is the thermal rectification value, $\nu$ is a dimensionless parameter of frequency oscillations, $\gamma'$ is a dimensionless parameter related to the onset of thermal rectification, and $Bi_{d,0}$ is the ratio of the thermal resistance of the linear thermal mass to the mean thermal resistance of the thermal diode.

Thermal diodes of the present disclosure can be tuned to improve performance based, at least in part, on the size and the thermal effusivity of the diodes. As a result, the time scale for temperature fluctuations can exist between the forward and reverse diffusion time scales. Tuning the thermal diffusion time scale can include regulating and/or adjusting at least one of: (1) a geometry of the thermal diode(s) (e.g., length, width, depth); (2) a thermal effusivity of the thermal diode(s); (3) a temperature oscillation frequency associated with the diode(s); or (4) a spatial and temporal gradient associated with the diode(s). Tuning can also be achieved by tuning a dominant frequency associated with at least one of the diodes to the dominant frequency of temperature fluctuations to capture maximum amounts of temperature fluctuations to yield larger power outputs. Additional details about tuning that can be applied to the present disclosures is provided for in the patent application entitled "Material, Devices, and Methods for Resonant Ambient Thermal Energy Harvesting," of Strano et al. that is incorporated by reference above.

It will be appreciated that the diode of FIGS. 3A and 3B can be representative of either or both of the first and second thermal diodes. The remaining dimensions of the diode can be on the scale of any unit of measure, e.g., millimeters, centimeters, meters, and so forth. In some embodiments, the diode can be sized such that the thermal resonator with which the diodes are used is easily portable between multiple locations. It will be appreciated that the shape of the thermal diodes is merely exemplary, and in some embodiments, the diodes can be circular, cylindrical, pyramidal, or another shape configured to be incorporated on, or otherwise a part of, the thermal resonator 100, or any other thermal resonator provided for herein or otherwise derivable from the present disclosures.

A time-averaged square temperature difference existing across the heat engine (related to power, as shown in Equation (9)), and normalized by the square of the maximum temperature difference attainable ($2T_A$) as the performance metric (Q), can be determined with the above parameters, as shown in Equation (20):

$$Q = \frac{P_{avg}}{P_{max}} = \frac{\Delta T_{avg}^2}{4T_A^2} \quad (20)$$

where $P_{avg}$ is the time average output, $P_{max}$ is the maximum power attainable, and $T_{avg}$ is the average temperature difference.

Measurements of the level of rectification ($\beta$) and sharpness of the change in the thermal conductivity for the thermal diode ($\gamma'$), where the parameter $\gamma'$ is a dimensionless parameter related to the onset of the thermal rectification, should be as large as possible to maximize thermal resonator performance. The parameter y is related to the steepness with respect to temperature bias of the modulation in thermal conductivity, as described above with respect to Equation (14). A reduced value of $\gamma$ indicates that a larger temperature bias is necessary to observe thermal rectification. Thus, the non-dimensionalization of $\gamma$ by the amplitude of temperature fluctuations ($T_A$) to yield $\gamma'$ is representative of the degree to which the thermal diode can be activated in a given temperature oscillating environment. In some embodiments, values of $\gamma'$ equation to about 100 can be a threshold to achieve optimal (Q>about 0.8) thermal resonator performance. Overall, as one skilled in the art will recognize, best power output yields occur for a high performance thermal diode (maximize $\beta$) that is easily activated in a certain temperature fluctuating environment (maximize $\gamma'$).

However, the dependence of device performance on the dimensionless frequency of temperature oscillation (v) and the thermal resistance ratio of the thermal diode and linear thermal mass ($Bi_{d,0}$) is non-monotonic, as certain combinations of these values can help to achieve optimal performance for a given level of thermal diode performance ($\beta$ and $\gamma'$). In particular, in some embodiments, lower levels of thermal rectification performance ($\beta$) necessitate more careful scaling of the thermal diffusion time scale relative to the frequency of temperature oscillations (v), as well as a careful consideration of the relative thermal resistances existing in the system ($Bi_{d,0}$).

Use and Storage of Electrical Energy Generated by Thermal Resonanace Devices

A person skilled in the art will recognize that energy and power generated by the various configurations of thermal resonance devices and thermal diodes provided for herein can be utilized in a variety of manners. Generally the resulting energy or power can be used to power objects, devices, systems, etc. with which the thermal resonance devices are incorporated or with which the thermal resonance devices are otherwise used in conjunction. Alternatively, or additionally, the resulting energy or power can be stored for future use, either by the same objects, devices, systems, etc. with which the thermal resonance devices are incorporated (including components thereof) or otherwise associated, or by objects, devices, systems, etc. located elsewhere. Additional details about the use of energy and power generated by thermal resonance devices is provided for in the patent application entitled "Material, Devices, and Methods for Resonant Ambient Thermal Energy Harvesting," of Strano et al. that is incorporated by reference above. Some non-limiting examples of objects, devices, systems, etc. that can use the generated energy and power include: buildings and their associated components (e.g., lights, computers, and/or other types of objects within, on, and/or near the building), vehicles and their associated components (e.g., radio, Bluetooth, lights, windows, and other power features of vehicles), sensors (e.g., wireless sensors, sensors that detect environmental changes and events, among many other types of sensors known to those skilled in the art), and many other objects and systems that require power to operate.

Although discussed in the present disclosure with respect to a building and a vehicle, a person skilled in the art will recognize that the building and vehicle are by no means limiting of the types of objects and/or the type of environments with which the present disclosures related to thermal resonance devices and thermal effusivity can be utilized. As discussed above, a variety of time varying temperature baths exist at a variety of frequencies, allowing thermal resonators provided for herein, or otherwise derivable from the present disclosures, to be used in a variety of ways and in conjunction with a variety of structures. The thermal resonator 100, and other configurations provided for herein or otherwise derivable therefrom, can be added to any structure that allows for conversion of thermal energy to power to occur. By way of non-limiting examples, the thermal resonator 100 can be using in conjunction with: drones and other similar devices based on lapse rates during vertical movement to create aerial temperature fluctuations; buildings based on temperature fluctuations, such as at the top and bottom; objects disposed underwater (e.g., gliders), which can have underwater temperature fluctuations, and can be enhanced by spatial movement; vehicles and planes based on exhaust rate changes at different times, such as when idling, to create temperature fluctuations; objects in space (e.g., satellites), based on temperature fluctuations that occur when the objects do or do not face the sun); machinery in a manufacturing facility or other building, which can rely on temperature fluctuations generated by the machinery and can be used, for example in industrial monitoring; duty cycles of electronics, such as cellular telephones and computers, which can create device fluctuations based on their use throughout the day; revolving doors based on temperature fluctuations that occur as portions of the door are exposed to environments inside and outside a building; a solar panel or cell, in which a thermal resonator can be used to hold or otherwise support the solar panel or cell, and temperature fluctuations can occur between one end that is proximate to the panel or cell and a second end that is proximate or disposed in the ground; and a pocket of an article of clothing, based on personal temperature fluctuations that surround a person during daily activities. Further, as discussed in greater detail below, objects themselves can be part of a thermal resonator, for example, by serving as one of the thermal masses. The examples provided in this paragraph are just some of the many objects that themselves can serve as one of the thermal masses.

Figure 8A:
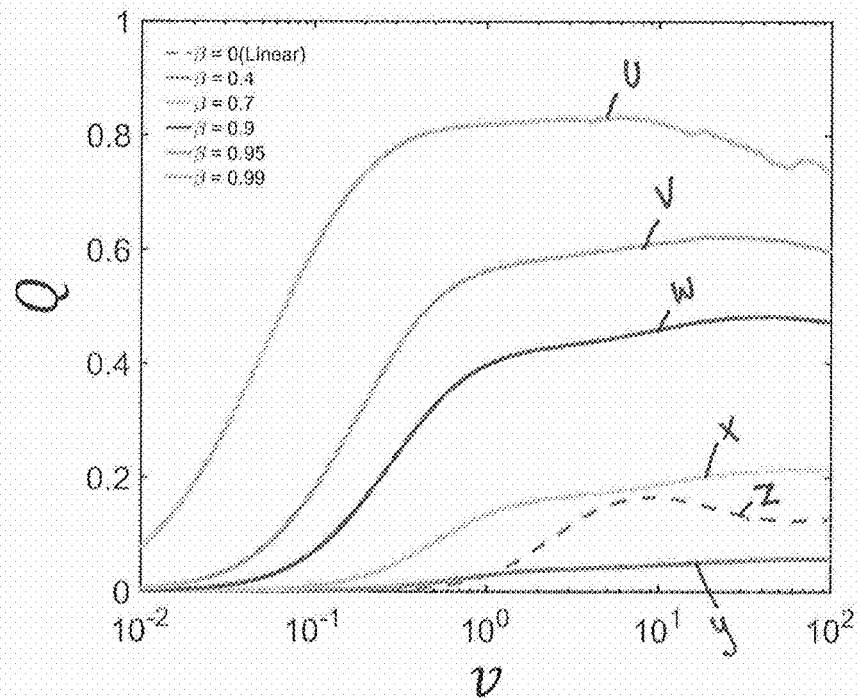
FIG. 8A is a graph illustrating performance (Q) of a thermal resonance device that includes two thermal diodes and two linear thermal masses.
Figure 8B:
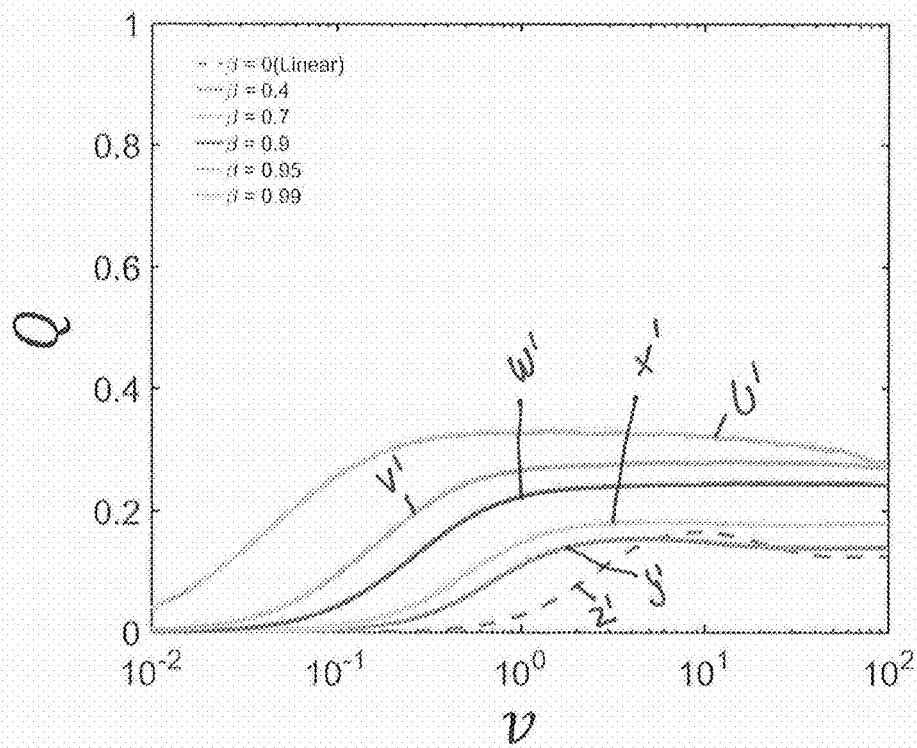
FIG. 8B is a graph illustrating performance (Q) of a thermal resonance device that includes one thermal diode and one linear thermal mass.

Comparing Thermal Resonators Having Thermal Diodes and those Lacking Thermal Diodes FIGS. 8A and 8B illustrate the differences of performance (Q) of thermal resonators with and without thermal diodes. As shown, holding $Bi_{d,0}$ constant at a value of 1, which is within the band for optimal performance for most levels of thermal rectification and values of ν, the thermal diffusion time scale of the linear thermal masses can be tuned to the frequency of temperature fluctuations for three types of thermal resonator designs: (1) the linear design in the absence of thermal diodes, as described and illustrated with respect to FIGS. 4A and 4B; (2) the thermal resonator incorporating two thermal diodes on its external boundaries, e.g., "a full thermal resonator," as described and illustrated with respect to FIGS. 5A-5C; and (3) a single linear thermal mass interfaced with a thermal diode on one side of the heat engine, e.g., a "half thermal resonator," which is not illustrated but is readily understood by a person skilled in the art in view of the present disclosures.

More specifically, FIG. 8A illustrates volcano plots comparing the performance factor (Q) as a function of the dimensionless temperature oscillation frequency (ν) at varying levels of thermal rectification (β) for a full thermal resonator and a linear thermal resonator; meanwhile, FIG. 8B illustrates volcano plots for these values for a half thermal resonator and a linear thermal resonator. The labeled values of thermal rectification (β) include 0 (Z), 0.4 (Y), 0.7 (X), 0.9 (W), 0.95 (V), and 0.99 (U) for the full thermal resonator, and 0 (Z'), 0.4 (Y'), 0.7 (X'), 0.9 (W'), 0.95 (V'), and 0.99 (U') for the half thermal resonator. It will be appreciated that the linear thermal resonator (β=0) in both plots corresponds to R=0, and Q corresponds to the time-averaged squared temperature difference existing across the heat engine normalized by the square of maximum temperature difference attainable ($2T_A$). The power capable of being generated by such thermal resonance devices is proportional to the squared temperature difference existing across the heat engine, as given by Equation (9).

An optimal thermal diffusion time scale for the linear thermal mass exists in relation to the frequency of temperature oscillations for each of the three designs. For example, as shown in FIG. 8A, at a threshold thermal diode performance (β~0.7), the full thermal resonator surpasses the performance of the linear thermal resonator (β=0, Q~0.15), while also significantly surpasses that of the linear thermal resonator (Q>0.8, approximately a factor of 5) as the performance of an ideal thermal diode is approached (β=1). Further, the thermal resonator's optimal performance regime widens significantly and becomes more broadband as the ideal thermal diode is approached. The half thermal resonator, as shown in FIG. 8B, surpasses the performance of the linear thermal resonator at a lower thermal rectification threshold (β~0.4), but its peak performance as ideal thermal rectification is approached (Q~0.3) is over a factor of two lower than the thermal resonator incorporating two thermal didoes (Q>0.8). It will be appreciated that in the case of practical usage, the linear thermal resonator and the half thermal resonator will both typically necessitate electrical rectification (dual polarity temperature differences inducing dual polarity voltage), while the full thermal resonator does not require electrical rectification (single polarity temperature differences inducing single polarity voltage).

By way of non-limiting example, in addition to the degree of thermal rectification, it can be important to consider the ability of the thermal diodes to experience an onset of thermal rectification in a given temperature fluctuating environment. As earlier described, the onset of thermal rectification for a thermal resonator in a temperature fluctuating environment can depend, at least in part, on the amplitude of temperature fluctuations ($T_A$), as well as the steepness in the change of thermal conductivity with respect to the direction of the temperature bias (γ). This yields the dimensionless parameter γ', which is discussed in greater detail above.

In addition to optimal thermal diode performance, the ability of the temperature fluctuations to activate thermal rectification can often be significant for desirable diode performance. For example, for a given thermal diode, the amplitude and frequency of temperature fluctuations can dictate the diode's ability to dynamically rectify. The amplitude of temperature fluctuations is related to γ', while the frequency of temperature fluctuations relates to the ability of the thermal diode to reach a steady state in the fluctuating thermal bath. For example, in some embodiments, γ'=100 can be a threshold to achieve optimal (Q>0.8) thermal resonator performance, given a sufficient level of thermal rectification (β>0.9) for the full thermal resonator design.

As suggested by FIGS. 8A and 8B, in some embodiments thermal diodes that are exposed to typical ambient temperature fluctuations ($T_A$ equal to about 10° C., corresponding to γ'=10) can result in approximately a two-fold enhancement in performance (Q~0.3) compared with the linear thermal resonator (Q~0.15). In some embodiments, five-fold enhancement in performance (Q>0.8), as shown in FIG. 8A, can occur with a temperature fluctuation amplitude of approximately 100° C. (corresponding to γ'=100).

One skilled in the art will recognize that the ability of the thermal diode to reach a steady state in a given temperature fluctuating environment with a time scale related to its frequency (ω) can impact performance. For example, the scalability of the thermal diode can determine whether the thermal diode is capable of reaching steady state. Thermal diodes that incorporate phase-change materials, as well as thermal diodes that include elements with strong temperature-dependent thermal conductivities can be scalable.

As described above, the thermal diodes provided for in the present disclosure can be formed at an interface, or junction, of a phase invariant material (material A) and a phase-change material (material B). A non-limiting exemplary configuration of material A can include a foam whose porosity can be varied. For example, to fabricate the about 90.7% porosity poly(high internal phase emulsion) foam discussed above can involve fabricating an oil phase and a water phase. In making the oil phase, about 0.7 mL Styrene and about 0.3 mL divinylbenzene can be added into a vial, followed by about 0.025 g RAFT and about 0.2 g Span® 80. The whole resulting mixture can then be put into sonication for dispensing.

In making the water phase, about 0.15 g Potassium persulfate and about 0.84 g Calcium chloride can be dissolved in about 60 mL deionized water. About 10 ML of the water phase can subsequently be added into oil phase dropwise under homogenization at a speed of about 8000 rpm to obtain a high internal phase emulsion. The result can then be put into about a 70° C. silicone oil bath for about 24 hours for polymerization. After the time elapses, the polymerized emulsion can be submerged into deionized water for about two days and methanol for about two days, sequentially. It will be appreciated that some of the best results can be achieved when the solvent is renewed about 5 times throughout this procedure. The polymerized emulsion can be placed in a vacuum oven at about 50° C. overnight to arrive at the final foam.

A non-limiting exemplary configuration of material B can include a paraffin/foam hybrid (PFH). For example, an octadecane-based paraffin-polystyrene foam hybrid (PFH-O) can be fabricated by adding octadecane into a beaker. The empty PFH foam can be submerged in liquid octadecane and the beaker can be placed in vacuum oven at about 40° C. for about two hours. After the time elapses, the PFH-O can be removed and the residual octadecane can be wiped off the surface, e.g., with a tissue.

A person skilled in the art, in view of the present disclosures, will recognize that many of the parameters provided for above to create and/or use the thermal diodes in conjunction with thermal resonators can be varied and can depend, at least in part, on the environment in which the thermal diodes are going to be used, the other components of the thermal resonator, and many of the variables described herein that impact the performance factor of the diodes, and thus the resonator. The disclosures of various properties are in no way limiting to how thermal diodes can be made and used in conjunction with the present disclosures of thermal resonators.

Although it has been indicated before, it bears repeating that the present disclosures allow for a plethora of different thermal resonators having different thermal diodes to be created, with the backbone being that pre-existing components can be individually tailored for various uses. Accordingly, the illustrated diodes and their commensurate shapes and/or length, materials, and thermal resonator concepts, as well as the way they are combined to create different methods, uses, etc. are in no way limiting. A person skilled in the art, in view of the present disclosures, will understand how to apply the teachings of one embodiment to other embodiments either explicitly or implicitly provided for in the present disclosures. Further, a person skilled in the art will appreciate further features and advantages of the invention based on the above-described embodiments. Accordingly, the invention is not to be limited by what has been particularly shown and described, except as indicated by the appended claims. Additional details related to the present disclosure can be found in an article entitled "Microscale solid-state thermal diodes enabling ambient temperature thermal circuits for energy applications," written by Song Wang et al., and published by the Royal Society of Chemistry on May 10, 2017, which can be found at https://pubs.rsc.org/en/content/articlelanding/2017/cp/c7cp02445b#!divAbstract as of the date the present application was filed, as well as other information contained at that link, such as the "Supplementary information," which can be found directly at www.rsc.org/suppdata/c7/cp/c7cp02445b/c7cp02445b1.pdf as of the date the present application was filed. Still further details related to the present disclosure will be available in a paper entitled "Persistent, Single-Polarity Energy Harvesting from Ambient Thermal Fluctuations using a Thermal Resonance Device with Thermal Diodes" written by Anton L. Cottrill et al., along with related "Supporting Information," both of which have not published as of the date the present application was filed. All publications and references cited herein, including the aforementioned articles and related materials, and previously referenced patent applications, are expressly incorporated herein by reference in their entireties.

What is claimed is:

1. A method of harvesting energy, comprising:
operating a thermal resonance device having at least two thermal diodes to:
translate a spatial temperature difference between the at least two thermal diodes by a heat engine into electrical energy having a single polarity voltage output,
wherein the thermal resonance device operates to translate the spatial temperature difference that results from movement-induced temperature fluctuations in which the thermal resonance device is disposed, the movement-induced temperature fluctuations including atmospheric lapse rate with respect to altitude, sea depth, geographical location, or sensors built into everyday objects, and
wherein the spatial temperature difference results from ambient thermal fluctuations directly captured by the at least two thermal diodes.

2. The method of claim 1, wherein operating a thermal resonance device further comprises causing a heat flow to travel from a first thermal diode of the two thermal diodes, towards the heat engine disposed between the two thermal diodes, and from the energy conversion component towards a second thermal diode of the two thermal diodes.

3. The method of claim 1, wherein operating a thermal resonance device further comprises causing each of the two thermal diodes to reach steady state when the spatial temperature difference between the two thermal diodes is translated into electrical energy.

4. The method of claim 1, further comprising:
causing at least a portion of the electrical energy that results from translating a spatial temperature difference between two thermal diodes into electrical energy having a single polarity voltage output to be stored.

5. The method of claim 1, further comprising:
causing at least a portion of the power that results from translating a spatial temperature difference between two thermal diodes into electrical energy having a single polarity voltage output to be used to at least one of power one or more components of an object or system associated with the thermal resonance device.

6. The method of claim 1, further comprising:
determining a performance factor of at least one thermal diode of the thermal resonance device; and
optimizing the amount of electrical energy that is outputted by the thermal resonance device in view of the determined performance factor.

7. The method of claim 1, further comprising optimizing the amount of electrical energy that is outputted by the thermal resonance device by adjusting at least one of a thermal rectification value of the thermal resonance device, a dimensionless parameter of frequency oscillations of the thermal resonance device, a dimensionless parameter related to an onset of thermal rectification of the thermal resonance device, or a ratio of a thermal resistance of a linear thermal mass of the thermal resonance device to a mean thermal resistance of one of the two thermal diodes.

8. The method of claim 7, wherein optimizing the amount of electrical energy that is outputted by the thermal resonance device further comprises adjusting either or both of the thermal rectification value of the thermal resonance device and the dimensionless parameter related to an onset of thermal rectification of the thermal resonance device, the dimensionless parameter related to an onset of thermal rectification of the thermal resonance device comprising a sharpness of a change in thermal conductivity for at least one of the two thermal diodes.

9. The method of claim 1, wherein the ambient thermal fluctuations occur due to one or more of diurnal temperature fluctuations or movement-induced temperature fluctuations that include one or more of altitude, sea depth, or atmospheric lapse rate.

10. The method of claim 1, wherein each of the at least two thermal diodes includes a junction between a phase-change material and a phase invariant material.

11. The method of claim 1, wherein each of the at least two thermal diodes are disposed on opposite ends of a first and a second thermal mass such that the at least two thermal diodes are disposed on external boundaries with the environment.

12. The method of claim 1, wherein translating the spatial temperature difference between the at least two thermal diodes further comprises directly capturing and transforming ubiquitous temperature fluctuations via thermal rectification across the heat engine.

13. A method of harvesting energy, comprising:
operating a thermal resonance device having at least two thermal diodes to:
translate a spatial temperature difference between the at least two thermal diodes into electrical energy having a single polarity voltage output,
wherein a dominant frequency associated with at least one of the at least two thermal diodes is tuned to a dominant frequency of temperature fluctuations during operation of at least one of the at least two thermal diodes to capture maximum amounts of temperature fluctuations to yield larger power outputs.

14. The method of claim 13, wherein the spatial temperature difference results from ambient thermal fluctuations captured by the at least two thermal diodes.

15. The method of claim 13, wherein translating the spatial temperature difference is performed by a heat engine.

16. The method of claim 12, wherein translating the spatial temperature difference bypasses electrical rectification.

17. The method of claim 1, wherein the thermal resonance device is disposed below ground when translating the spatial temperature difference.

18. The method of claim 1, wherein the electrical energy is generated on a substantially persistent basis such that the thermal resonator generates heating or cooling throughout any cycle of the day.

19. The method of claim 13, wherein tuning the at least two thermal diodes further includes adjusting one or more of: (1) a geometry of the at least two thermal diodes; (2) a thermal effusivity of the at least two thermal diodes; (3) a temperature oscillation frequency associated with the at least two thermal diodes; or (4) a spatial and temporal gradient associated with the at least two thermal diodes.

20. The method of claim 1, further comprising operating the thermal resonance device having at least two thermal diodes to use a first thermal mass associated with a first of the at least two thermal diodes and a second thermal mass associated with a second of the at least two thermal diodes to capture ambient thermal fluctuations, the first and second thermal masses being different objects.

21. The method of claim 20, wherein the first and second thermal masses have a primary purpose that does not include capturing ambient thermal fluctuations.

22. The method of claim 13, further comprising operating the thermal resonance device having at least two thermal diodes to use a first thermal mass associated with a first of the at least two thermal diodes and a second thermal mass associated with a second of the at least two thermal diodes to capture ambient thermal fluctuations, the first and second thermal masses being different objects.

23. The method of claim 22, wherein the first and second thermal masses have a primary purpose that does not include capturing ambient thermal fluctuations.

* * * * *